(12) United States Patent
Kim et al.

(10) Patent No.: US 11,009,729 B2
(45) Date of Patent: May 18, 2021

(54) FLEXIBLE DISPLAY DEVICE INCLUDING A FLEXIBLE SUBSTRATE HAVING A BENDING PART AND A CONDUCTIVE PATTERN AT LEAST PARTIALLY DISPOSED ON THE BENDING PART

(71) Applicant: Samsung Display Co., Ltd., Yongin-si (KR)

(72) Inventors: Kyungseop Kim, Hwaseong-si (KR); Sangyoun Han, Seoul (KR); Sangkyu Choi, Daejeon (KR); Jae-wook Kang, Hwaseong-si (KR); Sungkyun Park, Suwon-si (KR); Yongwoo Park, Yongin-si (KR); Jungha Son, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/157,014

(22) Filed: Oct. 10, 2018

(65) Prior Publication Data
US 2019/0042031 A1    Feb. 7, 2019

Related U.S. Application Data

(62) Division of application No. 15/075,844, filed on Mar. 21, 2016, now Pat. No. 10,133,428.

(30) Foreign Application Priority Data

May 29, 2015 (KR) .................. 10-2015-0076440
Dec. 3, 2015 (KR) .................. 10-2015-0171680

(51) Int. Cl.
*G06F 3/044* (2006.01)
*G02F 1/1333* (2006.01)
(Continued)

(52) U.S. Cl.
CPC .. *G02F 1/133305* (2013.01); *G02F 1/136286* (2013.01); *G06F 3/0445* (2019.05);
(Continued)

(58) Field of Classification Search
None
See application file for complete search history.

(56) References Cited

U.S. PATENT DOCUMENTS 4,054,540 A * 10/1977 Michalchik .............. H01B 1/22
 252/512
5,585,198 A * 12/1996 Maeda .................. B82Y 10/00
 257/E43.005
(Continued)

FOREIGN PATENT DOCUMENTS

EP    1643301    4/2006
JP    06-293964    10/1994
(Continued)

OTHER PUBLICATIONS

Extended European Search Report dated Oct. 20, 2016 in European Patent Application No. 16169488.0.
(Continued)

*Primary Examiner* — Chad M Dicke
(74) *Attorney, Agent, or Firm* — H.C. Park & Associates, PLC

(57) ABSTRACT

A flexible display device including a flexible substrate and a conductive pattern. The flexible substrate includes a bending part in which a bending occurs. At least a portion of the conductive pattern is disposed on the bending part and the conductive pattern includes grains. Each grain has a grain size of about 10 nm to about 100 nm.

6 Claims, 21 Drawing Sheets

(51) Int. Cl.
   *G02F 1/1362* (2006.01)
   *H05K 1/02* (2006.01)
   *H05K 1/09* (2006.01)
   *H05K 3/14* (2006.01)

(52) U.S. Cl.
   CPC ........... *H05K 1/028* (2013.01); *H05K 1/0298* (2013.01); *H05K 1/09* (2013.01); *H05K 3/14* (2013.01); *G02F 2001/13629* (2013.01); *G02F 2001/136295* (2013.01); *G02F 2202/36* (2013.01); *G06F 2203/04102* (2013.01); *G06F 2203/04103* (2013.01); *H05K 2201/0326* (2013.01)

(56) References Cited

U.S. PATENT DOCUMENTS

| | | | | |
|---|---|---|---|---|
| 6,004,442 A * | 12/1999 | Choulga | G01N 27/3275 | 204/415 |
| 6,335,772 B1 | 1/2002 | Sato et al. | | |
| 6,403,481 B1 * | 6/2002 | Matsuda | H01L 21/288 | 257/E21.174 |
| 6,504,228 B1 * | 1/2003 | Sone | H01L 28/75 | 257/295 |
| 7,244,990 B2 * | 7/2007 | Takafuji | H01L 21/6835 | 257/347 |
| 7,638,786 B2 * | 12/2009 | Matsui | C23C 14/0623 | 257/2 |
| 8,097,330 B2 | 1/2012 | Nashiki et al. | | |
| 8,421,759 B2 * | 4/2013 | Chien | G02B 5/201 | 178/18.06 |
| 8,568,603 B2 | 10/2013 | Tanabe et al. | | |
| 9,005,750 B2 * | 4/2015 | Ozawa | G06F 3/045 | 428/329 |
| 9,112,166 B2 * | 8/2015 | Gaynor | B82Y 20/00 | |
| 9,299,472 B2 * | 3/2016 | Sun | H01B 1/026 | |
| 9,671,886 B2 * | 6/2017 | Yoo | G06F 3/0412 | |
| 10,019,110 B2 * | 7/2018 | Weaver | G06F 3/041 | |
| 10,038,154 B2 * | 7/2018 | Lee | H01L 51/0097 | |
| 10,048,816 B2 * | 8/2018 | Park | G06F 3/044 | |
| 10,055,058 B2 * | 8/2018 | Kimura | G02F 1/134309 | |
| 10,090,468 B2 * | 10/2018 | Gotanda | H01L 51/0012 | |
| 10,101,867 B2 * | 10/2018 | Akimoto | G06F 3/044 | |
| 10,126,585 B2 * | 11/2018 | Kimura | G06F 3/0412 | |
| 10,139,879 B2 * | 11/2018 | Yamazaki | G06F 1/263 | |
| 10,167,572 B2 * | 1/2019 | Veerasamy | C30B 25/02 | |
| 10,203,819 B2 * | 2/2019 | Liu | G06F 3/044 | |
| 10,268,315 B2 * | 4/2019 | McMillen | G01L 1/18 | |
| 10,331,005 B2 * | 6/2019 | Hertel | G02F 1/1368 | |
| 10,345,941 B2 * | 7/2019 | Nakai | B32B 7/02 | |
| 10,510,457 B2 * | 12/2019 | Shingai | C23C 14/14 | |
| 10,578,914 B2 * | 3/2020 | Ueki | G02F 1/133602 | |
| 2001/0017753 A1 * | 8/2001 | Mori | B82Y 10/00 | 360/324.12 |
| 2001/0018158 A1 * | 8/2001 | Yoshida | G03G 9/08782 | 430/119.86 |
| 2002/0001886 A1 * | 1/2002 | Ohtani | G02B 27/017 | 438/151 |
| 2002/0020836 A1 * | 2/2002 | Kikuchi | H01L 28/55 | 257/1 |
| 2003/0143375 A1 * | 7/2003 | Noguchi | B82Y 10/00 | 428/143 |
| 2003/0168992 A1 * | 9/2003 | Noguchi | H01L 27/3276 | 315/169.3 |
| 2004/0033391 A1 * | 2/2004 | Gouke | G11B 5/66 | 428/836.1 |
| 2004/0087068 A1 * | 5/2004 | Yudasaka | H01L 21/76877 | 438/149 |
| 2004/0106530 A1 | 6/2004 | Daviot et al. | | |
| 2004/0150869 A1 * | 8/2004 | Kasai | B81B 3/0083 | 359/290 |
| 2006/0065897 A1 | 3/2006 | Hirai et al. | | |
| 2006/0236917 A1 | 10/2006 | Denda | | |
| 2007/0085778 A1 | 4/2007 | Yoshida | | |
| 2008/0122007 A1 * | 5/2008 | Kawai | H01L 21/823814 | 257/374 |
| 2010/0026648 A1 | 2/2010 | Kimura et al. | | |
| 2010/0079962 A1 | 4/2010 | Hashi | | |
| 2010/0117975 A1 * | 5/2010 | Cho | G06F 1/1626 | 345/173 |
| 2010/0288995 A1 * | 11/2010 | Ozawa | H01L 45/1273 | 257/4 |
| 2010/0304048 A1 * | 12/2010 | Yukinobu | C08J 7/0423 | 428/1.1 |
| 2011/0209749 A1 * | 9/2011 | Yang | G06F 3/041 | 136/255 |
| 2012/0028123 A1 * | 2/2012 | Asari | H01M 4/587 | 429/231.8 |
| 2012/0111718 A1 * | 5/2012 | Haishi | G06F 3/045 | 204/192.1 |
| 2012/0126716 A1 * | 5/2012 | Hirakawa | G09G 3/22 | 315/246 |
| 2012/0147472 A1 | 6/2012 | Kajiya et al. | | |
| 2012/0152400 A1 * | 6/2012 | Michishita | B23B 1/00 | 138/177 |
| 2012/0223637 A1 * | 9/2012 | Shin | H01J 11/12 | 313/582 |
| 2012/0255167 A1 * | 10/2012 | Badaye | G06F 3/044 | 29/846 |
| 2012/0256642 A1 * | 10/2012 | Badaye | G06F 3/044 | 324/658 |
| 2012/0318412 A1 * | 12/2012 | Ohta | C21D 8/1211 | 148/548 |
| 2013/0038513 A1 * | 2/2013 | Park | H01L 27/3218 | 345/55 |
| 2013/0052458 A1 | 2/2013 | Nagamoto et al. | | |
| 2013/0098444 A1 * | 4/2013 | Kawashima | H01L 21/02422 | 136/258 |
| 2013/0222326 A1 * | 8/2013 | Cok | G06F 3/044 | 345/174 |
| 2013/0300686 A1 * | 11/2013 | Yoon | G06F 3/041 | 345/173 |
| 2014/0041924 A1 * | 2/2014 | Cok | G06F 3/044 | 174/268 |
| 2014/0048131 A1 | 2/2014 | Tanaka et al. | | |
| 2014/0055702 A1 | 2/2014 | Park et al. | | |
| 2014/0354591 A1 * | 12/2014 | Chu | G06F 3/044 | 345/174 |
| 2015/0027755 A1 | 1/2015 | Tsujimoto et al. | | |
| 2015/0049053 A1 | 2/2015 | Kim et al. | | |
| 2015/0086789 A1 * | 3/2015 | Kajihara | C23C 14/086 | 428/412 |
| 2015/0138139 A1 | 5/2015 | Tokuno et al. | | |
| 2015/0140211 A1 * | 5/2015 | Strobl | C23C 16/26 | 427/249.6 |
| 2015/0227248 A1 * | 8/2015 | Yamazaki | G06F 3/0412 | 345/173 |
| 2015/0242012 A1 | 8/2015 | Petcavich et al. | | |
| 2015/0280061 A1 * | 10/2015 | Ito | H01L 33/16 | 257/94 |
| 2015/0316958 A1 * | 11/2015 | Takesue | G06F 3/03 | 345/173 |
| 2015/0345009 A1 | 12/2015 | Hayakawa et al. | | |
| 2016/0011703 A1 * | 1/2016 | Park | G06F 3/047 | 345/174 |
| 2016/0033800 A1 | 2/2016 | Liu | | |
| 2016/0062510 A1 | 3/2016 | Tomohisa et al. | | |
| 2016/0139702 A1 * | 5/2016 | Franklin | G06F 3/044 | 345/174 |
| 2016/0147362 A1 | 5/2016 | Eim et al. | | |
| 2016/0202804 A1 * | 7/2016 | Park | G06F 3/044 | 345/174 |
| 2016/0216790 A1 * | 7/2016 | Ebihara | G06F 3/044 | |
| 2016/0274398 A1 * | 9/2016 | Hirakata | G06F 3/044 | |
| 2016/0370903 A1 * | 12/2016 | Hur | G06F 3/044 | |
| 2017/0045645 A1 * | 2/2017 | Fujino | B32B 27/16 | |
| 2017/0131804 A1 * | 5/2017 | Sata | G06F 3/041 | |
| 2017/0144408 A1 * | 5/2017 | Sata | G02B 5/3025 | |
| 2017/0160829 A1 * | 6/2017 | Liu | G06F 3/044 | |

(56) References Cited

U.S. PATENT DOCUMENTS

FOREIGN PATENT DOCUMENTS

| | | |
|---|---|---|
| JP | 09-129376 | 5/1997 |
| JP | 10-209160 | 8/1998 |
| JP | 2002-116455 | 4/2002 |
| JP | 2004-014287 | 1/2004 |
| JP | 2006-252837 | 9/2006 |
| JP | 2006-269338 | 10/2006 |
| JP | 2006-310070 | 11/2006 |
| JP | 2010-225293 | 10/2010 |
| KR | 1020000075302 | 12/2000 |
| KR | 1020060070751 | 6/2006 |
| KR | 1020150014106 | 2/2015 |
| KR | 1020150019429 | 2/2015 |
| KR | 1020150020580 | 2/2015 |
| KR | 1020150020894 | 2/2015 |
| KR | 1020150020150 | 5/2015 |
| TW | 201242774 | 11/2012 |
| TW | 201247810 | 12/2012 |
| TW | 201316359 | 4/2013 |
| TW | 201423516 | 6/2014 |
| TW | 201447921 | 12/2014 |
| TW | 201514529 | 4/2015 |

OTHER PUBLICATIONS

Non-Final Office Action dated Dec. 22, 2017, issued in U.S. Appl. No. 15/075,844.
Final Office Action dated Apr. 4, 2018, issued in U.S. Appl. No. 15/075,844.
Notice of Allowance dated Jul. 3, 2018, issued in U.S. Appl. No. 15/075,844.

\* cited by examiner

FIG. 11B

FLEXIBLE DISPLAY DEVICE INCLUDING A FLEXIBLE SUBSTRATE HAVING A BENDING PART AND A CONDUCTIVE PATTERN AT LEAST PARTIALLY DISPOSED ON THE BENDING PART

CROSS-REFERENCE TO RELATED APPLICATION

This application is a Division of U.S. patent application Ser. No. 15/075,844, filed on Mar. 21, 2016, which claims priority from and the benefit of Korean Patent Application No. 10-2015-0076440, filed on May 29, 2015 and No. 10-2015-0171680, filed on Dec. 3, 2015, all of which are hereby incorporated by reference for all purposes as if fully set forth herein.

BACKGROUND

Field

Exemplary embodiments relate to a flexible display device and a method of manufacturing the same. More particularly, exemplary embodiments relate to a flexible display device capable of a crack occurring due to bending, and a method of manufacturing the flexible display device.

Discussion of the Background

A display device displays various images on a display screen to provide a user with information. In recent years, a display device, which is bendable, has been developed. As opposed to a flat panel display device, a flexible display device is capable of being folded, rolled, or curved as a paper. The flexible display device capable of being deformed in various shapes is made for the user's convenience of moving or handling.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a flexible display device capable of preventing a crack from occurring due to bending.

Exemplary embodiments also provide a method of manufacturing the flexible display device.

Additional aspects will be set forth in the detailed description which follows, and, in part, will be apparent from the disclosure, or may be learned by practice of the inventive concept.

An exemplary embodiment discloses a flexible display device including a flexible substrate and a conductive pattern. The flexible substrate includes a bending part. The conductive pattern includes a plurality of grains and at least a portion of the conductive pattern is disposed on the bending part. Each of the grains has a grain size of about 10 nm to about 100 nm.

An exemplary embodiment also discloses a flexible display device including a flexible display panel and a touch screen panel. The flexible display panel includes a panel bending part. The touch screen panel includes a touch bending part and is disposed on the flexible display panel. At least one of the flexible display panel and the touch screen panel includes a conductive pattern including a plurality of conductive pattern layers, each having a grain size of about 10 nm to about 100 nm, and at least one of the panel bending part and the touch bending part includes the conductive pattern.

An exemplary embodiment also discloses a flexible display device including a flexible display panel and a touch screen panel. The touch screen panel includes a touch bending part. The touch bending part includes a sensing electrode having a mesh structure; the sensing electrode includes a plurality of sensing electrode layers; and the sensing electrode layers include a same material.

An exemplary embodiment also discloses a method of manufacturing a flexible display device, including preparing a flexible substrate and providing a conductive pattern on the flexible substrate, the conductive pattern having a grain size of about 10 nm to about 100 nm.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

FIG. 11A and FIG. 11B are SEM images showing first to fourth embodiment examples and first and second comparison examples.

DETAILED DESCRIPTION OF THE ILLUSTRATED EMBODIMENTS

Figure 1A:
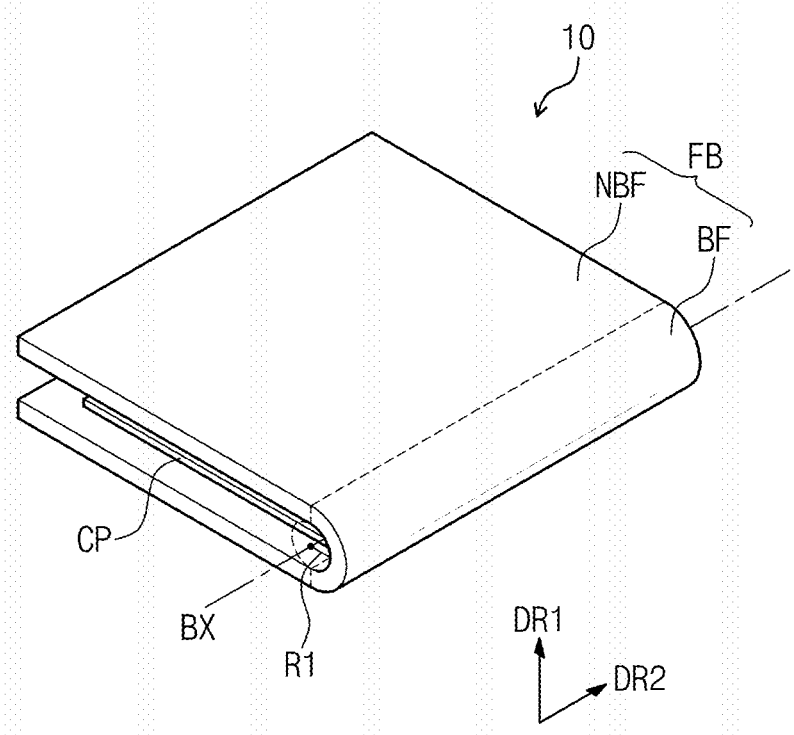
FIG. 1A, FIG. 1B, and FIG. 1C are perspective views illustrating a flexible display device according to an exemplary embodiment of the present disclosure.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. The regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 1B:
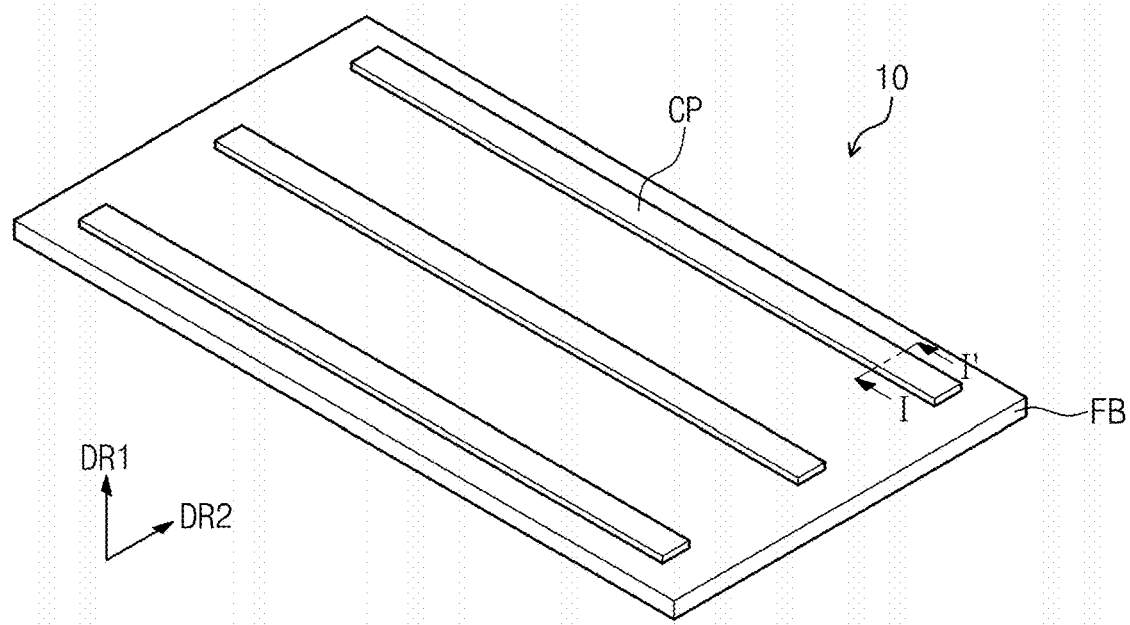
Figure 1C:
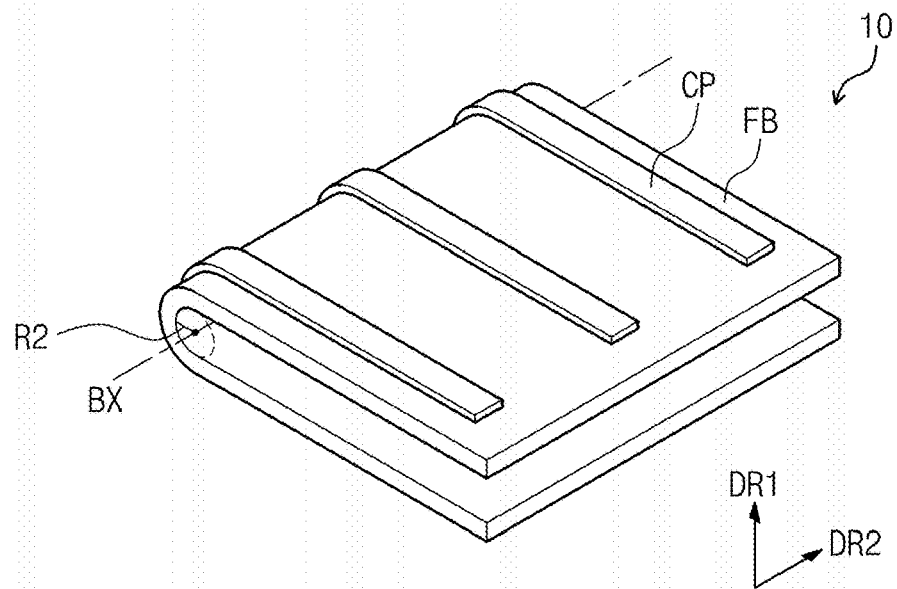

FIGS. 1A, 1B, and 1C are perspective views showing a flexible display device 10 according to an exemplary embodiment of the present disclosure.

Referring to FIGS. 1A, 1B, and 1C, the flexible display device 10 includes a flexible substrate FB and a conductive pattern CP. The conductive pattern CP is disposed on the flexible substrate FB in a first direction DR1. The term of "flexible" used herein means that the substrate is bendable, and thus, the flexible substrate FB may be completely folded or partially bent. The flexible substrate FB may include, but is not limited to, a plastic material or an organic polymer, e.g., polyethylene (PET), polyethylene naphthalate (PEN), polyimide, polyether sulfone, etc. The material for the flexible substrate FB is selected in consideration of mechanical strength, thermal stability, transparency, a surface smoothness, ease of handling, water repellency, etc. The flexible substrate FB may be transparent.

The flexible display device 10 is operated in a first mode or a second mode. The flexible substrate FB includes a bending part BF and a non-bending part NBF. The bending part BF is bent in the first mode with respect to a bending axis BX extending in a second direction DR2 and is unbent in the second mode. The bending part BF is connected to the non-bending part NBF. The non-bending part NBF is not bent in the first and second modes. At least a portion of the conductive pattern CP is disposed on the bending part BF. The term "bending" used herein means that the flexible substrate FB is curved in a specific shape as a result of an external force.

Referring to FIGS. 1A and 1C, at least a portion of the flexible substrate FB and the conductive pattern CP is bent in the first mode. Referring to FIG. 1B, the bending part BF is unbent in the second mode.

The first mode includes a first bending mode and a second bending mode. Referring to FIG. 1A, the flexible display device 10 is bent in one direction with respect to the bending axis BX in the first bending mode. That is, the flexible display device 10 is inwardly bent in the first bending mode. Hereinafter, when the flexible display device 10 is bent with respect to the bending axis BX, a state in which a distance between portions, which face each other after the conductive pattern CP is bent, of the conductive pattern CP is less than a distance between portions, which face each other after the flexible substrate FB is bent, of the flexible substrates FB is referred to as an inner bending. In the inner bending state, a surface of the bending part BF has a first radius of curvature R1. The first radius of curvature R1 is in a range from about 1 mm to about 10 mm.

Referring to FIG. 1C, the flexible display device 10 is bent in a direction opposite to the one direction in FIG. 1A with respect to the bending axis BX in the second bending mode. That is, the flexible display device 10 is outwardly bent in the second bending mode. Hereinafter, when the flexible display device 10 is bent with respect to the bending axis BX, a state that a distance between portions, which face each other after the flexible substrate FB is bent, of the flexible substrate FB is less than a distance between portions, which face each other after the conductive pattern CP is bent, of the conductive pattern CP is referred to as an outer bending. In the outer bending state, a surface of the bending part BF has a second radius of curvature R2. The second radius of curvature R2 may or may not be equal to the first radius of curvature R1. The second radius of curvature R2 is in a range from about 1 to about 10 mm.

In FIGS. 1A and 1C, when the flexible display device 10 is bent with respect to the bending axis BX, the distance between the portions facing each other of the flexible substrate FB is constant, but it should not be limited thereto or thereby. That is, the distance between the portions facing each other of the flexible substrate FB may not be constant. In addition, in FIGS. 1A and 1C, when the flexible display device 10 is bent with respect to the bending axis BX, an area of one portion of the portions of the bent flexible substrate FB may be equal to an area of the other portion of the portions of the bent flexible substrate FB, but it should not be limited thereto or thereby. That is, the area of one portion of the portions of the bent flexible substrate FB may be different from the area of the other portion of the portions of the bent flexible substrate FB.

FIGS. 2A to 2D are cross-sectional views taken along a line I-I' of FIG. 1B.

Referring to FIGS. 1A to 1C and 2A, at least the portion of the conductive pattern CP is disposed on the bending part. The conductive pattern CP includes a plurality of grains GR. The grains GR are crystal grains obtained by regularly arranging component atoms. Each grain GR has a grain size of about 10 nm to about 100 nm.

Hereinafter, the grain size may indicate an average of several particle diameters or a maximum particle diameter. In addition, the grain size of each grain GR may be in a range from about 10 nm to about 100 nm, the average of the grain sizes of the grains GR may be in a range from about 10 nm to about 100 nm, or a representative value of the grain sizes may be in a range from about 10 nm to about 100 nm.

When the grain size of the conductive pattern CP is less than about 10 nm, a resistance of the conductive pattern CP increases, and thus, the power consumption required to drive the flexible display device 10 increases. When the grain size of the conductive pattern CP greater than about 100 nm, it is difficult to secure flexibility of the bending of the conductive pattern CP as a result of the large grain size. As a result, a crack or a disconnection occurs in the conductive pattern CP, resulting in reduced reliability of the flexible display device 10.

In general, when the grain size of the conductive pattern CP becomes small, the resistance of the conductive pattern CP increases and the power consumption required to drive the flexible display device 10 increases, but the flexible display device 10 may have flexibility since the flexibility is secured. On the contrary, when the grain size of the conductive pattern CP becomes large, the resistance of the conductive pattern CP decreases, but the crack or disconnection of the conductive pattern CP occurs since it is difficult to secure the flexibility.

The conductive pattern CP of the flexible display device 10 according to the present exemplary embodiment has the grain size greater than or equal to about 10 nm and less than or equal to about 90 nm. Accordingly, the conductive pattern CP has the appropriate resistance to secure proper driving characteristics and improved flexibility. Therefore, the reliability of the flexible display device 10 is improved.

In the conductive pattern CP, about 200 grains to about 1200 grains are arranged within a unit area of about 1.0 square micrometers ($\mu m^2$). The term of "within the unit area of about 1.0 square micrometers ($\mu m^2$)" means that the unit area may be defined in an arbitrary area on a plane surface of the conductive pattern CP. When the number of the grains GR in the unit area of about 1.0 square micrometers ($\mu m^2$) is less than about 200, it is difficult to secure bending flexibility. Thus, the crack or disconnection of the connection pattern CP occurs and the reliability of the flexible display device 10 is reduced. In addition, when the number of the grains GR in the unit area of about 1.0 square micrometers ($\mu m^2$) exceeds about 1200, the resistance of the conductive pattern CP increases, and thus, the power consumption required to drive the flexible display device 10 increases.

The conductive pattern CP includes at least one of a metal, a metal alloy, and a transparent conductive oxide, but it should not be limited thereto or thereby. The grains GR may be at least one of grains of metal, grains of metal alloy, and grains of transparent conductive oxide.

The metal may include, but not limited to, at least one of Al, Cu, Ti, Mo, Ag, Mg, Pt, Pd, Au, Ni, Nd, Ir, and Cr.

The transparent conductive oxide may include, but is not limited to, at least one of indium tin oxide (ITO), indium zinc oxide (IZO), zinc oxide (ZnO), and indium tin zinc oxide (ITZO).

Referring to FIGS. 1A to 1C, and 2A to 2D, the conductive pattern CP includes a plurality of conductive pattern layers CPL. The number of the conductive pattern layers CPL included in the conductive pattern CP may be two, three, four, five, or six, but it should not be limited thereto or thereby. That is, the conductive pattern CP may include seven or more conductive pattern layers CPL. The grains GR arranged in different conductive pattern layers CPL are not connected to each other. That is, the grains are included in each of the conductive pattern layers CPL.

Each grain GR of the conductive pattern layers CPL has a grain size of about 10 nm to about 100 nm. When the grain size of the grains GR of the conductive pattern layers CPL is less than about 10 nm, a resistance of the conductive pattern layers CPL increases, and thus, power consumption required to drive the flexible display device 10 increases. When the grain size of grains GR of the conductive pattern layers CPL is greater than about 100 nm, it is difficult to secure flexibility of the bending of the conductive pattern layers CPL as a result of the large grain size. As a result, a crack or a disconnection occurs in the conductive pattern layers CPL, and reliability of the flexible display device 10 is reduced.

Each of the conductive pattern layers CPL has a thickness of about 10 nm to abut 150 nm. When the thickness of each of the conductive pattern layers CPL is less than about 10 nm, the number of interfaces of the conductive pattern layers CPL increases even though the overall thickness of the conductive pattern CP is not increased, and thus, the resistance of the conductive pattern CP increases. Accordingly, power consumption required to drive the flexible display device 10 increases. In addition, the reliability of the conductive pattern layers CPL may be reduced when each conductive pattern layer CPL is manufactured or provided. When the thickness of each of the conductive pattern layers CPL is greater than about 150 nm, it is difficult to secure flexibility of the conductive pattern layers CPL when the conductive pattern layers CPL are bent. As a result, a crack or a disconnection occurs in the conductive pattern layers CPL, and reliability of the conductive pattern layers CPL is reduced.

Each of the conductive pattern layers CPL may include at least one of a metal, a metal alloy, and a transparent conductive oxide, but it should not be limited thereto or thereby.

The metal may include, but not limited to, at least one of Al, Cu, Ti, Mo, Ag, Mg, Pt, Pd, Au, Ni, Nd, Ir, and Cr.

The transparent conductive oxide may include, but not limited to, at least one of indium tin oxide (ITO), indium zinc oxide (IZO), zinc oxide (ZnO), and indium tin zinc oxide (ITZO).

The conductive pattern layers CPL may include the same material, e.g., aluminum (Al), but they should not be limited thereto or thereby. That is, the conductive pattern layers CPL may include Cu or ITO.

The conductive pattern layers CPL may include the different materials from each other. For instance, when the conductive pattern CP includes two conductive pattern layers CPL, one conductive pattern layer CPL of the two conductive pattern layers CPL may include aluminum (Al) and the other conductive pattern layer CPL of the two conductive pattern layers CPL may include copper (Cu). In addition, when the conductive pattern CP includes four conductive pattern layers CPL, the conductive pattern CP includes a conductive pattern layer including aluminum (Al), a conductive pattern layer including copper (Cu), a conductive pattern layer including aluminum (Al), and a conductive pattern layer including copper (Cu), which are sequentially stacked one on another. Further, when the conductive pattern CP includes four conductive pattern layers CPL, the conductive pattern CP includes a conductive pattern layer including aluminum (Al), a conductive pattern layer including silver (Ag), a conductive pattern layer including aluminum (Al), and a conductive pattern layer including silver (Ag), which are sequentially stacked one on another.

Figure 2A:
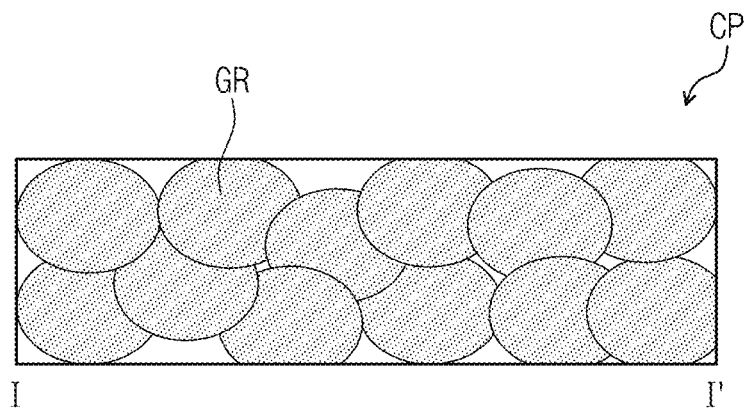
FIG. 2A, FIG. 2B, FIG. 2C, and FIG. 2D are cross-sectional views taken along a line I-I' of FIG. 1B.
Figure 2B:
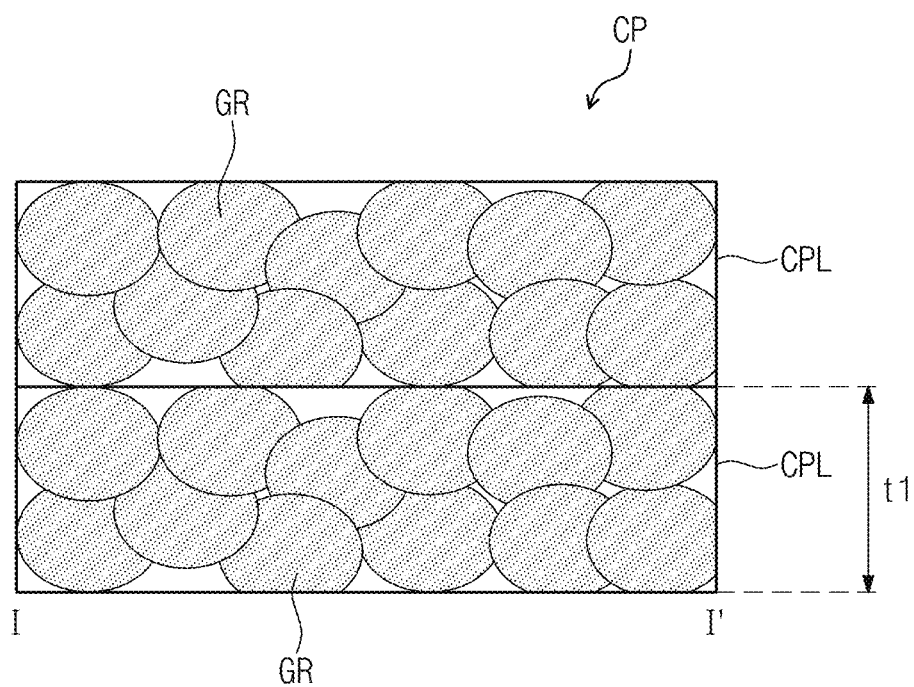
Figure 2C:
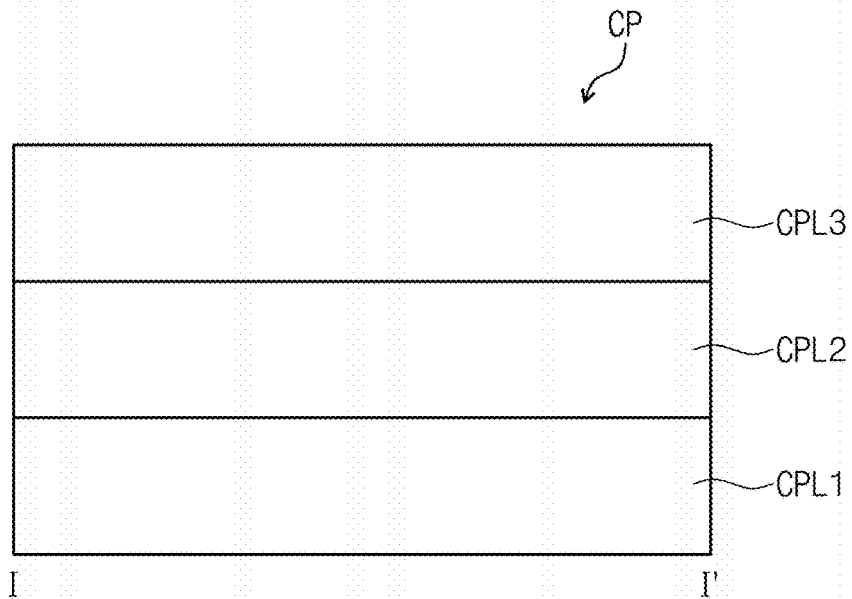

Referring to FIG. 2C, the conductive pattern CP includes a first conductive pattern layer CPL1, a second conductive pattern layer CPL2, and a third conductive pattern layer CPL3. The second conductive pattern layer CPL2 is disposed on the first conductive pattern layer CPL1. The third conductive pattern layer CPL3 is disposed on the second conductive pattern layer CPL2.

The first, second, and third conductive pattern layers CPL1, CPL2, and CPL3 may include the same material. For instance, each of the conductive pattern layers CPL may include aluminum (Al), but it should not be limited thereto or thereby. For example, each of the conductive pattern layers CPL may include copper (Cu). The first, second, and third conductive pattern layers CPL1, CPL2, and CPL3 may have the same thickness, or at least one conductive pattern layer of the first, second, and third conductive pattern layers CPL1, CPL2, and CPL3 may have a different thickness from that of the other conductive pattern layers.

For instance, the conductive pattern CP may include the first conductive pattern layer CPL1 including aluminum (Al), the second conductive pattern layer CPL2 disposed on the first conductive pattern layer CPL1 and including copper (Cu), and the third conductive pattern layer CPL3 disposed on the second conductive pattern layer CPL2 and including aluminum (Al). In this case, the thicknesses of the first, second, and third conductive pattern layers CPL1, CPL2, and CPL3 may be about 100 nm, about 100 nm, and about 100 nm, respectively.

For instance, the conductive pattern CP may include the first conductive pattern layer CPL1 including titanium (Ti), the second conductive pattern layer CPL2 disposed on the first conductive pattern layer CPL1 and including copper (Cu), and the third conductive pattern layer CPL3 disposed on the second conductive pattern layer CPL2 and including aluminum (Al). In this case, the thicknesses of the first, second, and third conductive pattern layers CPL1, CPL2, and CPL3 may be about 200 nm, about 150 nm, and about 150 nm, respectively.

Figure 2D:
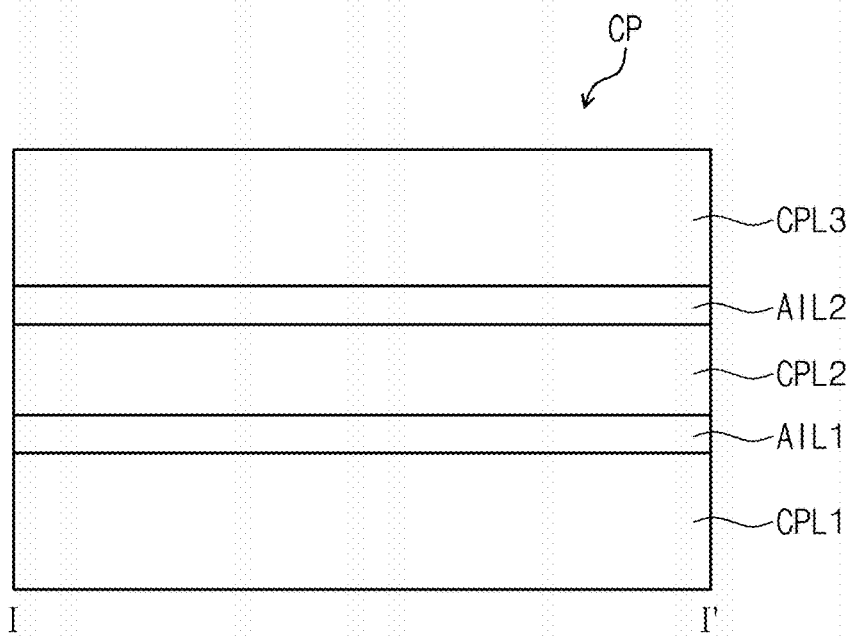

Referring to FIG. 2D, the conductive pattern CP may include a first conductive pattern layer CPL1, a first air layer AIL1, a second conductive pattern layer CPL2, a second air layer AIL2, and a third conductive pattern layer CPL3.

The first air layer AIL1 is disposed on the first conductive pattern layer CPL1. The second conductive pattern layer CPL2 is disposed on the first air layer AIL1. The second air layer AIL2 is disposed on the second conductive pattern CPL2. The third conductive pattern layer CPL3 is disposed on the second air layer AIL2.

Each of the first and third conductive pattern layers CPL1 and CPL3 has a thickness equal to or greater than about 10 nm and equal to or less than about 150 nm, and the second conductive pattern layer CPL2 has a thickness equal to or greater than about 5 nm and less than about 10 nm.

A region of the first conductive pattern layer CPL1, which makes contact with the first air layer AIL1, may be oxidized. Regions of the second conductive pattern layer CPL2, which respectively make contact with the first air layer AIL1 and the second air layer AIL2, may be oxidized. A region of the third conductive pattern layer CPL3, which makes contact with the second air layer AIL2, may be oxidized.

For instance, the conductive pattern CP may include the first conductive pattern CPL1 including aluminum (Al), the second conductive pattern layer CPL2 disposed on the first conductive pattern layer CPL1 and including titanium (Ti), and the third conductive pattern CPL3 disposed on the second conductive pattern layer CPL2 and including aluminum (Al). In this case, the thicknesses of the first, second, and third conductive pattern layers CPL1, CPL2, and CPL3 may be about 150 nm, about 5 nm, and about 150 nm, respectively.

The first conductive pattern layer CPL1 in the region making contact with the first air layer AIL1 is oxidized and exists in aluminum oxide, and the second conductive pattern layer CPL2 in the region making contact with the first air layer AIL1 and the second conductive pattern layer CPL2 in the region making contact with the second air layer AIL2 are oxidized and exist in titanium oxide, and the third conductive pattern layer CPL3 in the region making contact with the second air layer AIL2 is oxidized and exists in aluminum oxide.

Figure 3A:
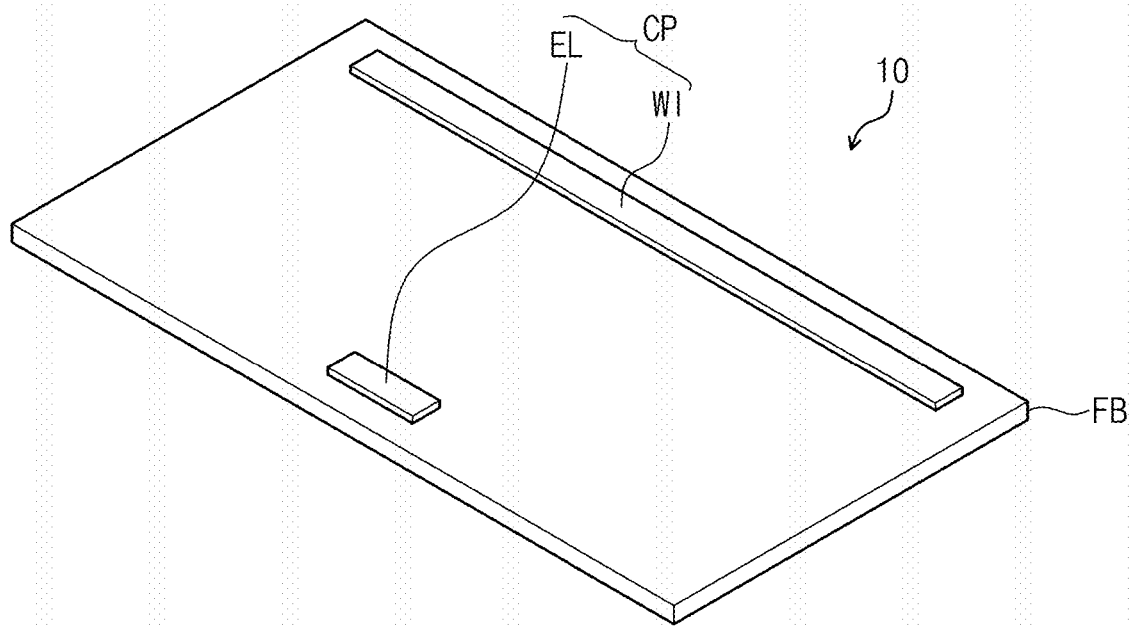
FIG. 3A is a perspective view showing a flexible display device according to an exemplary embodiment of the present disclosure.
Figure 3B:
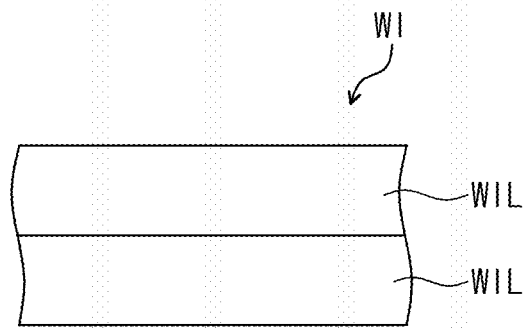
FIG. 3B is a cross-sectional view showing a line included in a flexible display device according to an exemplary embodiment of the present disclosure.
Figure 3C:
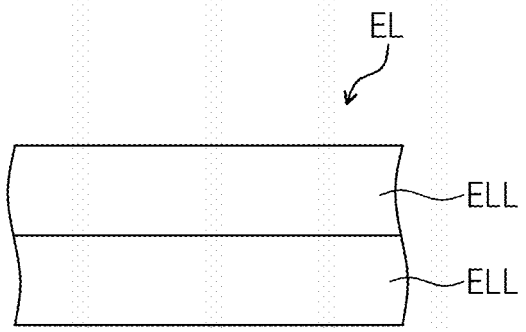
FIG. 3C is a cross-sectional view showing an electrode included in a flexible display device according to an exemplary embodiment of the present disclosure.

FIG. 3A is a perspective view showing a flexible display device according to an exemplary embodiment of the present disclosure, FIG. 3B is a cross-sectional view showing a wiring included in a flexible display device according to an exemplary embodiment of the present disclosure, and FIG. 3C is a cross-sectional view showing an electrode included in a flexible display device according to an exemplary embodiment of the present disclosure.

Referring to FIGS. 1A to 1C and 3A, the conductive pattern CP includes a wiring WI and an electrode EL. The wiring WI may be included in a touch screen panel TSP (refer to FIG. 5A) and a flexible display panel DP (refer to FIG. 5A).

The wiring WI is disposed on the flexible substrate FB. At least a portion of the wiring WI is disposed on the bending part BF. For instance, the wring WI may be disposed on the bending part BF and may not be disposed on the non-bending part NBF. As another way, the wring WI may be disposed on the bending part BF and the non-bending part NBF.

The wiring WI has a grain size of about 10 nm to about 100 nm. When the grain is size of the wiring WI is less than about 10 nm, a resistance of the wiring WI increases, and thus, power consumption required to drive the flexible display device 10 increases. When the grain size of the wiring WI is greater than about 100 nm, it is difficult to secure flexibility of the bending of the wiring WI since the grain size is excessively large. As a result, a crack or a disconnection occurs in the wiring WI, and reliability of the flexible display device 10 is reduced.

Referring to FIGS. 1A to 1C, 3A, and 3B, the wiring WI includes a plurality of wiring layers WIL. The number of the wiring layers WIL included in the wiring WI is two, three, four, five, or six, but it should not be limited thereto or thereby. That is, the wiring WI may include seven or more wiring layers WIL. The grains arranged in different wiring layers WIL are not connected to each other. That is, the grains are included in each of the wiring layers WIL.

Each of the wiring layers WIL has a grain size of about 10 nm to about 100 nm. When the grain size of the wiring layers WIL is less than about 10 nm, a resistance of the wiring layers WIL increases, and thus, power consumption required to drive the flexible display device 10 increases. When the grain size of the wiring layers WIL is greater than about 100 nm, it is difficult to secure flexibility of the bending of the wiring layers WIL since the grain size is excessively large. As a result, a crack or a disconnection occurs in the wiring layers WIL, and reliability of the flexible display device 10 is reduced.

Each of the wiring layers WIL has a thickness of about 10 nm to abut 150 nm. When the thickness of each of the wiring layers WIL is less than about 10 nm, the number of the interfaces of the wiring layers WIL increases even though the overall thickness of the wiring WI is not increased, and thus, the resistance of the wiring WI increases. Accordingly, power consumption required to drive the flexible display device 10 increases. In addition, the reliability of the wiring layers WIL may be reduced when each wiring layer WIL is manufactured or provided. When the thickness of each of the wiring layers WIL exceeds about 150 nm, it is difficult to secure flexibility of the wiring layers WIL when the wiring layers WIL are bent. As a result, a crack or a disconnection occurs in the wiring layers WIL. and reliability of the wiring layers WIL is reduced.

Each of the wiring layers WIL includes at least one of a metal, a metal alloy, and a transparent conductive oxide, but it should not be limited thereto or thereby.

The metal may include, but not limited to, at least one of Al, Cu, Ti, Mo, Ag, Mg, Pt, Pd, Au, Ni, Nd, Ir, and Cr.

The transparent conductive oxide may include, but not limited to, at least one of indium tin oxide (ITO), indium zinc oxide (IZO), zinc oxide (ZnO), and indium tin zinc oxide (ITZO).

Referring to FIGS. 1A to 1C, 3A, and 3C, the electrode EL is disposed on the flexible substrate FB. At least a portion of the electrode EL is disposed on the bending part BF. For instance, the electrode EL may be disposed on the bending part BF and may not be disposed on the non-bending part NBF. As another way, the electrode EL may be disposed on the bending part BF and the non-bending part NBF.

The electrode EL is electrically connected to the wiring WI. The electrode EL may be spaced apart from the wiring WI, but it should not be limited thereto or thereby. That is, the electrode EL may be integrally formed with the wiring WI.

The electrode EL and the wiring WI may be disposed on the same layer, but they should not be limited thereto or thereby. That is, the electrode EL and the wiring WI may be disposed on different layers from each other. Although not shown in figures, an intermediate layer may be disposed between the wiring WI and the electrode EL.

The electrode EL has a grain size of about 10 nm to about 100 nm. When the grain size of the electrode EL is less than about 10 nm, a resistance of the electrode EL increases, and thus, power consumption required to drive the flexible display device 10 increases. When the grain size of the electrode EL is greater than about 100 nm, it is difficult to secure flexibility of the bending of the electrode EL since the grain size is excessively large. As a result, a crack or a disconnection occurs in the electrode EL, and reliability of the flexible display device 10 is reduced.

The electrode EL includes a plurality of electrode layers ELL. The number of the electrode layers ELL included in the electrode EL is two, three, four, five, or six, but it should not be limited thereto or thereby. That is, the electrode EL may include seven or more electrode layers ELL. The grains arranged in different electrode layers ELL are not connected to each other. That is, the grains are included in each of the electrode layers ELL.

Each of the electrode layers ELL has a grain size of about 10 nm to about 100 nm. When the grain size of the electrode layers ELL is less than about 10 nm, a resistance of the electrode layers ELL increases since the number of the interfaces of the electrode layers ELL increases even though the overall thickness of the electrode EL is not increased. Thus, power consumption required to drive the flexible display device 10 increases. In addition, the reliability of the electrode layers ELL may be reduced when each electrode layer ELL is manufactured or provided. When the thickness of each of the electrode layers ELL is greater than about 150 nm, it is difficult to secure flexibility of the electrode layers ELL when the electrode layers ELL are bent. As a result, a crack or a disconnection occurs in the electrode layers ELL, and reliability of the electrode layers ELL is reduced.

Each of the electrode layers ELL includes at least one of a metal, a metal alloy, and a transparent conductive oxide, but it should not be limited thereto or thereby.

The metal may include, but not limited to, at least one of Al, Cu, Ti, Mo, Ag, Mg, Pt, Pd, Au, Ni, Nd, Ir, and Cr.

The transparent conductive oxide may include, but not limited to, at least one of indium tin oxide (ITO), indium zinc oxide (IZO), zinc oxide (ZnO), and indium tin zinc oxide (ITZO).

Figure 4A:
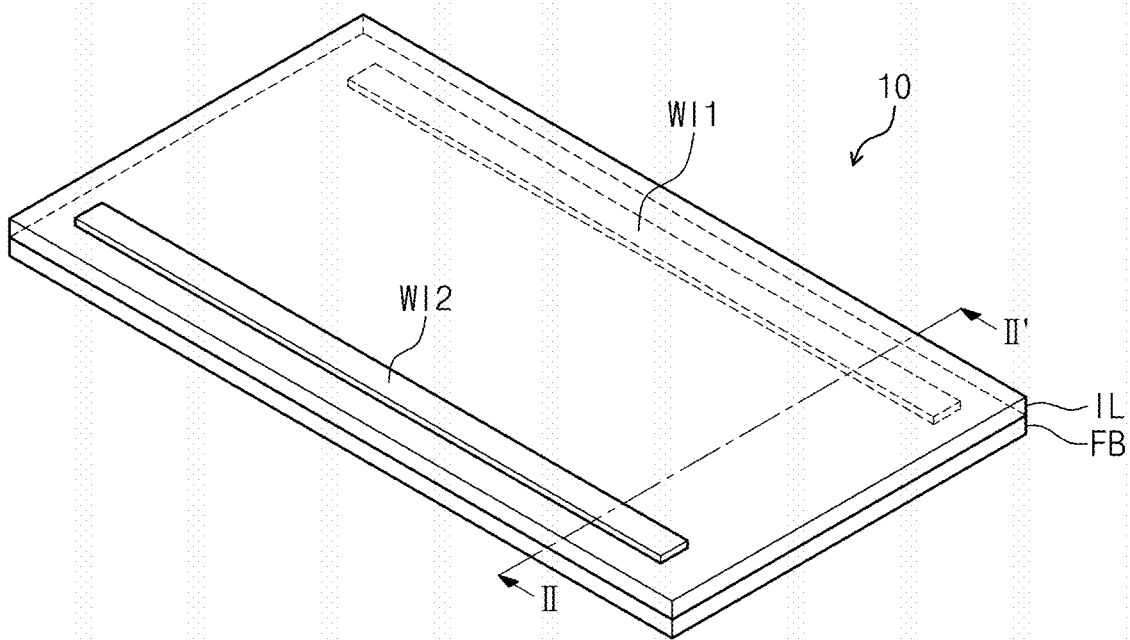
FIG. 4A is a perspective view showing a flexible display device according to an exemplary embodiment of the present disclosure.
Figure 4B:
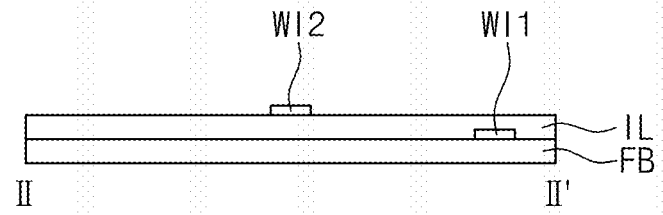
FIG. 4B is a cross-sectional view taken along a line II-II' of FIG. 4A.
Figure 4C:
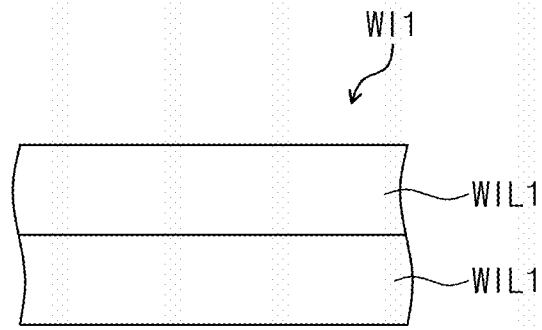
FIG. 4C is a cross-sectional view showing a first line included in a flexible display device according to an exemplary embodiment of the present disclosure.
Figure 4D:
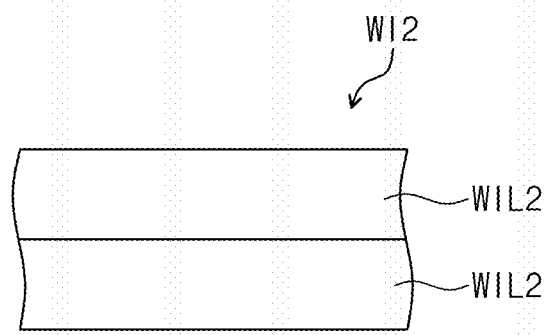
FIG. 4D is a cross-sectional view showing a second line included in a flexible display device according to an exemplary embodiment of the present disclosure.

FIG. 4A is a perspective view showing a flexible display device according to an exemplary embodiment of the present disclosure, FIG. 4B is a cross-sectional view taken along a line II-II' of FIG. 4A, FIG. 4C is a cross-sectional view showing a first wiring included in a flexible display device according to an exemplary embodiment of the present disclosure, and FIG. 4D is a cross-sectional view showing a second wiring included in a flexible display device according to an exemplary embodiment of the present disclosure.

Referring to FIGS. 1A to 1C, 4A, and 4B, the wiring WI includes the first wiring WI1 and the second wiring WI2. An insulating layer IL is disposed between the first and second wirings WI1 and WI2. The first wiring WI1 is disposed between the flexible substrate and the insulating layer IL and the second wiring WI2 is disposed on the insulating layer IL. The insulating layer IL may include, but not limited to, an organic insulating material or an inorganic insulating material.

Referring to FIG. 4C, the first wiring WI1 includes a plurality of first wiring layers WIL1. The number of the first wiring layers WIL1 included in the first wiring WI1 is two, three, four, five, or six, but it should not be limited thereto or thereby. That is, the first wiring WI may include seven or more first wiring layers WIL1. The second wiring WI2 includes two, three, four, five, or six second wiring layers WIL2, but it should not be limited thereto or thereby. That is, the second wiring WI2 may include seven or more second wiring layers WIL2.

Referring to FIGS. 1A to 1C and FIGS. 4A to 4D, each of the first and second wiring layers WIL1 and WIL2 has a grain size of about 10 nm to about 100 nm. When the grain size of the first and second wiring layers WIL1 and WIL2 is less than about 10 nm, a resistance of the first and second wiring layers WIL1 and WIL2 increases, and thus, power consumption required to drive the flexible display device 10 increases. When the grain size of the first and second wiring layers WIL1 and WIL2 is greater about 100 nm, it is difficult to secure flexibility of the bending of the first and second wiring layers WIL1 and WIL2 since the grain size is excessively large. As a result, a crack or a disconnection occurs in the first and second wiring layers WIL1 and WIL2, and reliability of the flexible display device 10 is reduced.

Each of the first and second wiring layers WIL1 and WIL2 has a thickness of about 10 nm to abut 150 nm. When the thickness of each of the first and second wiring layers WIL1 and WIL2 is less than about 10 nm, the number of the interfaces of the first wiring layers WIL1 increases even though the overall thickness of the first wiring WI1 is not increased and the number of the interfaces of the second wiring layers WIL2 increases even though the overall thickness of the second wiring WI2 is not increased. Thus, the resistance of the first wiring WI1 increases. Accordingly, power consumption required to drive the flexible display device 10 increases. In addition, the reliability of the first and second wiring layers WIL1 and WIL2 may be reduced when each of the first and second wiring layers WIL1 and WIL2 is manufactured or provided. When the thickness of each of the first and second wiring layers WIL1 and WIL2 is is greater than about 150 nm, it is difficult to secure flexibility of the first and second wiring layers WIL1 and WIL2 when the first wiring WI1 is bent. As a result, a crack or a disconnection occurs in the first and second wiring layers WIL1 and WIL2, and the reliability of the first and second wiring layers WIL1 and WIL2 is reduced.

Each of the first and second wiring layers WIL1 and WIL2 includes at least one of a metal, a metal alloy, and a transparent conductive oxide, but it should not be limited thereto or thereby.

The metal may include, but not limited to, at least one of Al, Cu, Ti, Mo, Ag, Mg, Pt, Pd, Au, Ni, Nd, Ir, and Cr.

The transparent conductive oxide may include, but not limited to, at least one of indium tin oxide (ITO), indium zinc oxide (IZO), zinc oxide (ZnO), and indium tin zinc oxide (ITZO).

Figure 5A:
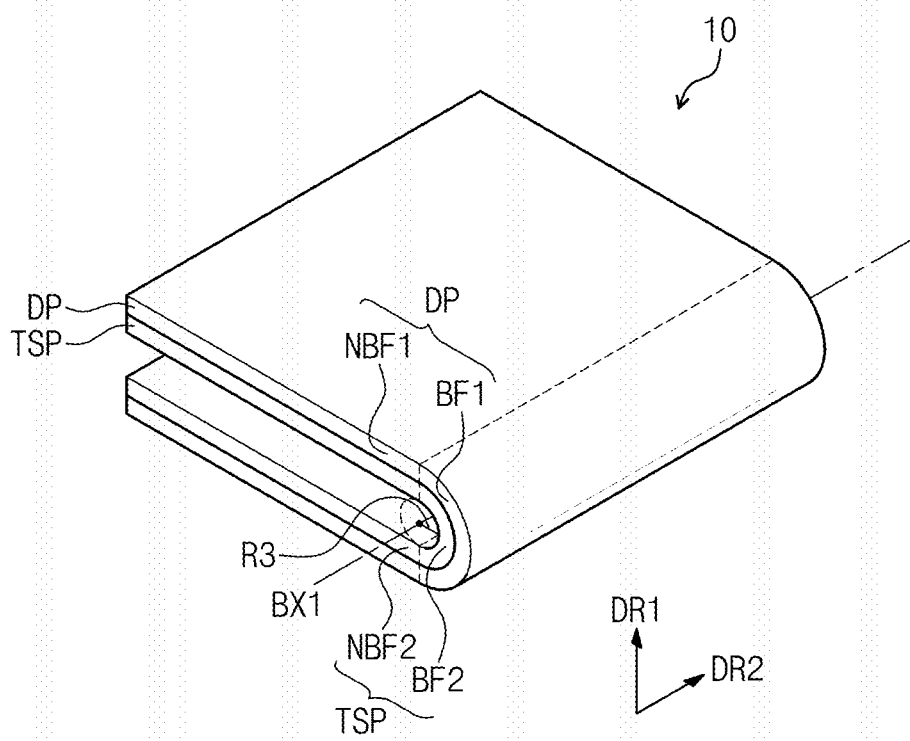
FIG. 5A, FIG. 5B, and FIG. 5C are perspective views showing a flexible display device according to an exemplary embodiment of the present disclosure.
Figure 5B:
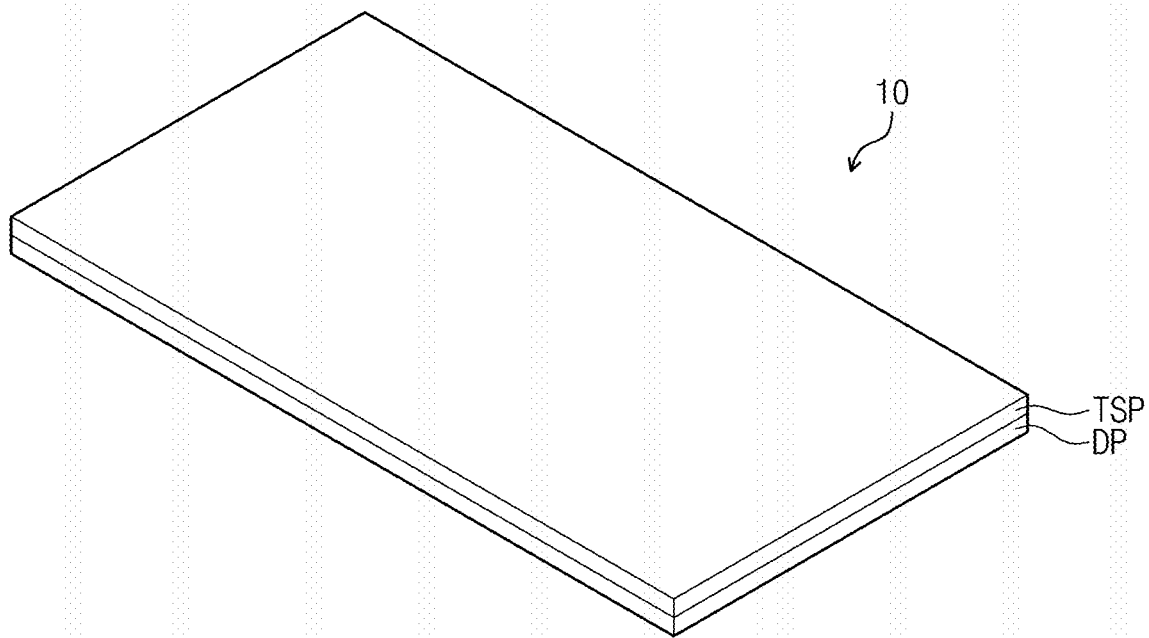
Figure 5C:
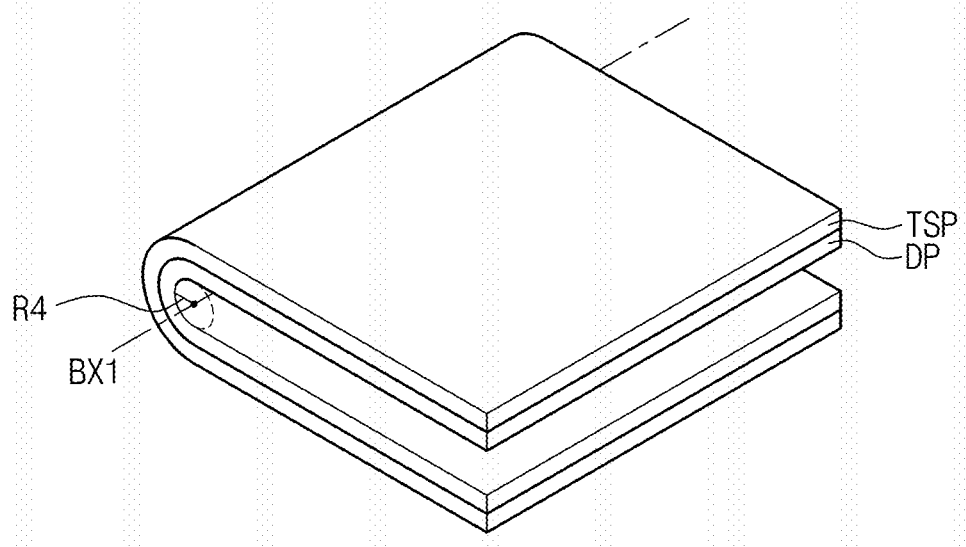

FIGS. 5A, 5B, and 5C are perspective views showing a flexible display device according to an exemplary embodiment of the present disclosure.

Referring to FIGS. 5A to 5C, the flexible display device 10 is operated in the first mode or the second mode. The flexible display device 10 includes the touch screen panel TSP and the flexible display panel DP. The touch screen panel TSP is disposed on the flexible display panel DP in the first direction DR1.

The touch screen panel TSP includes a touch bending part BF2 and a touch non-bending part NBF2. The touch bending part BF2 is bent in the first mode with respect to a bending axis BX1 extending in the second direction DR2, and is unbent in the second mode. The touch bending part BF2 is connected to the touch non-bending part NBF2. The touch non-bending part NBF2 is not bent in the first and second modes.

The flexible display panel DP includes a panel bending part BF1 and a panel non-bending part NBF1. The panel bending part BF1 is bent in the first mode with respect to the bending axis BX1 extending in the second direction DR2 and is unbent in the second mode. The panel bending part BF1 is connected to the panel non-bending part NBF1. The panel non-bending part NBF1 is not bent in the first and second modes.

Referring to FIGS. 5A and 5C, at least a portion of the touch screen panel TSP and the flexible display panel DP is bent in the first mode. Referring to FIG. 5B, the touch bending part BF2 of the touch screen panel TSP and the panel bending part BF1 of the flexible display panel DP are unbent in the second mode.

The first mode includes a first bending mode and a second bending mode. Referring to FIG. 5A, the flexible display device 10 is bent in one direction with respect to the bending axis BX1 in the first bending mode. The flexible display device 10 is inwardly bent in the first bending mode. When the flexible display device 10 is in the inner-bending state, a distance between portions facing each other of the touch screen panel TSP after the touch screen panel TSP is bent is shorter than a distance between portions facing each other of the flexible display panel DP after the flexible display panel DP is bent. In the inner-bending state, a surface of the touch bending part BF2 of the touch screen panel TSP has a third radius of curvature R3. The third radius of curvature R3 is in a range from about 1nm to about 10 nm.

Referring to FIG. 5C, the flexible display device 10 is bent in a direction opposite to the one direction of FIG. 5A with respect to the bending axis BX1 in the second bending mode. The flexible display device 10 is outwardly bent in the second bending mode. When the flexible display device 10 is in the outer-bending state, a distance between portions facing each other of the flexible display panel DP after the flexible display panel DP is bent is less than a distance between portions facing each other of the touch screen panel TSP after the touch screen panel TSP is bent. In the outer-bending state, a surface of the panel bending part BF1 of the flexible display panel DP has a fourth radius of curvature R4. The fourth radius of curvature R4 is in a range from about 1 nm to about 10 nm.

Referring to FIGS. 1A to 1C and 5A to 5C, at least one of the flexible display panel DP and the touch screen panel TSP includes a conductive pattern CP having a grain size of about 10 nm to about 100 nm. The conductive pattern CP is included in at least one of the panel bending part BF1 and the touch bending part BF2. The conductive pattern CP includes the conductive pattern layers CPL (refer to FIG. 2B) each having the grain size of about 10 nm to about 100 nm.

Figure 6A:
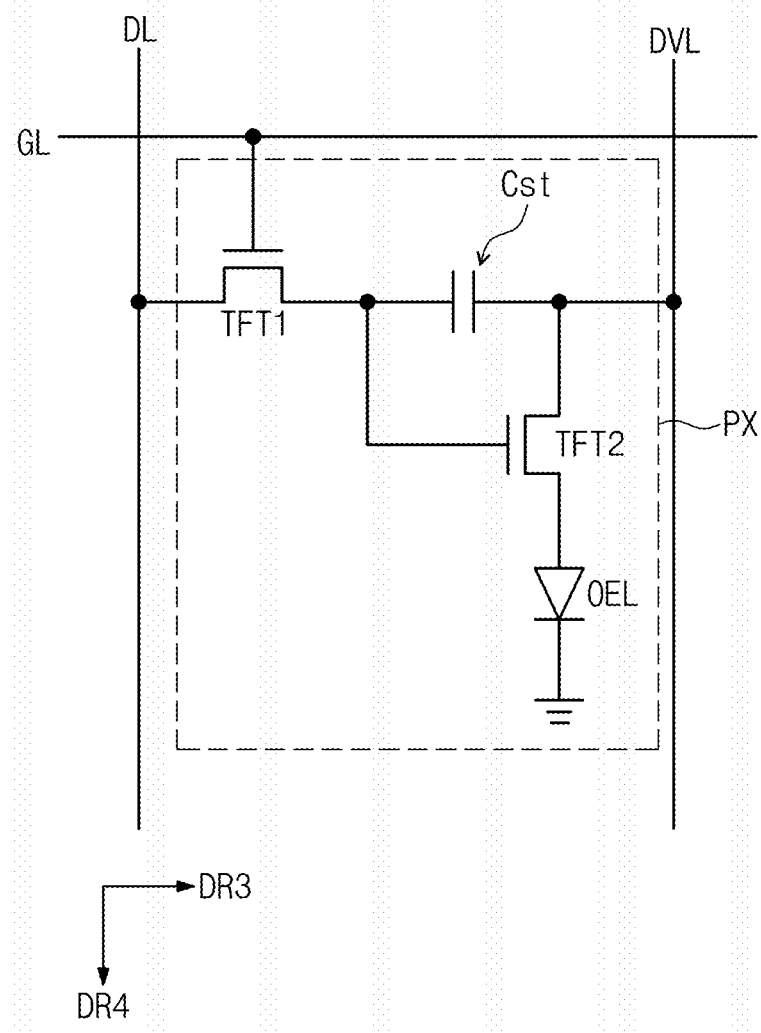
FIG. 6A is a circuit diagram showing one pixel of pixels included in a flexible display panel according to an exemplary embodiment of the present disclosure.
Figure 6B:
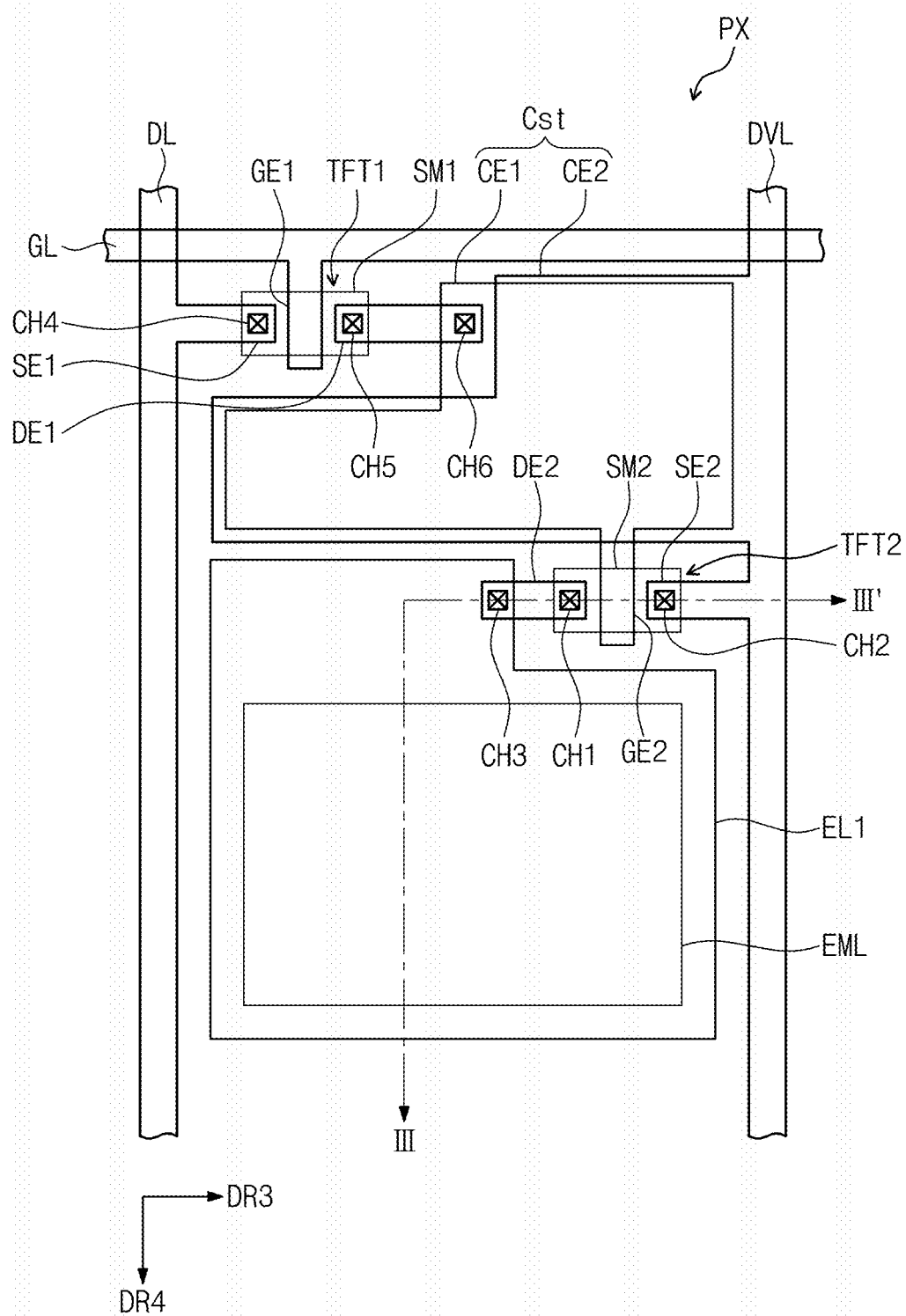
FIG. 6B is a plan view showing one pixel of pixels included in a flexible display panel according to an exemplary embodiment of the present disclosure.
Figure 6C:
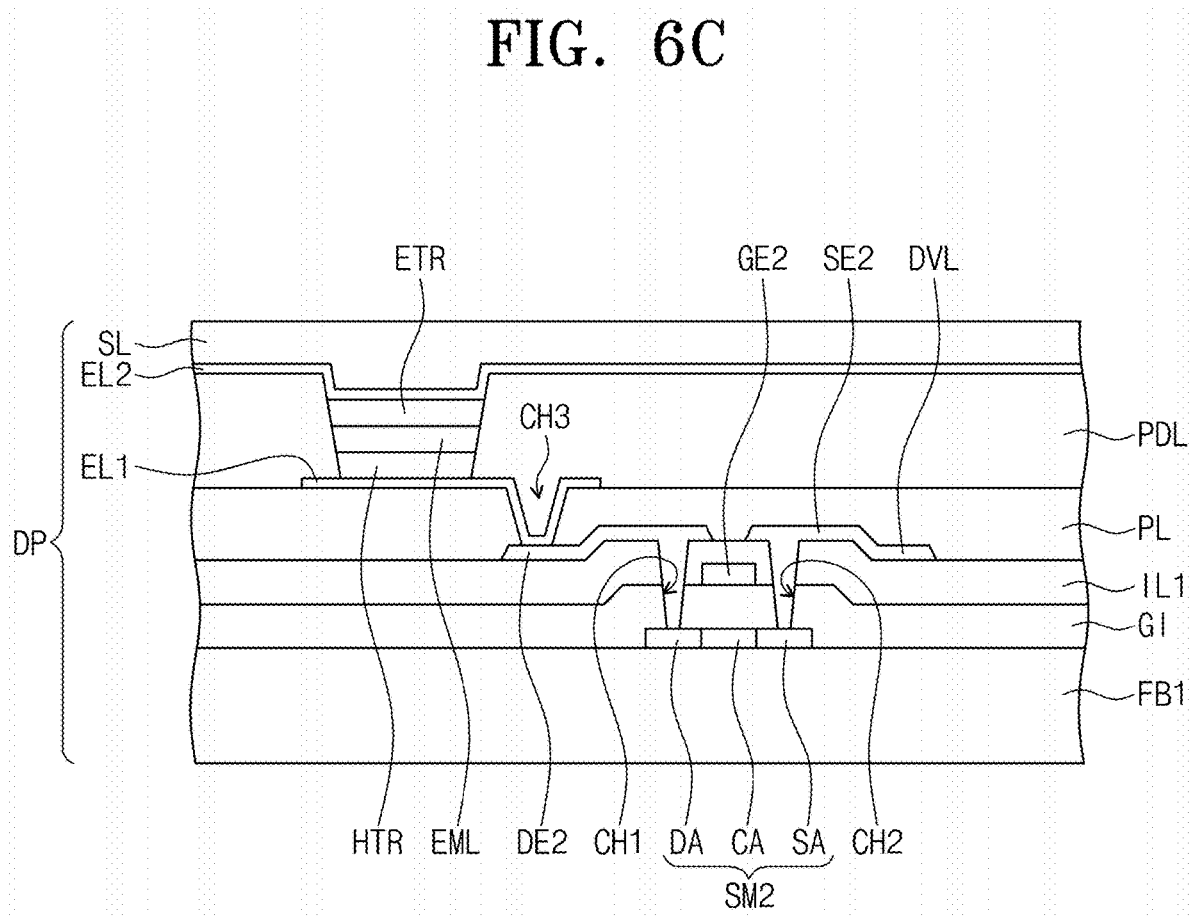
FIG. 6C is a cross-sectional view taken along a line III-III' of FIG. 6B.

FIG. 6A is a circuit diagram showing one of the pixels included in a flexible display panel according to an exemplary embodiment of the present disclosure, FIG. 6B is a plan view showing one pixel of pixels included in a flexible display panel according to an exemplary embodiment of the present disclosure, and FIG. 6C is a cross-sectional view taken along a line III-III' of FIG. 6B.

Hereinafter, an organic light emitting display panel will be described as the flexible display panel DP, but the flexible display panel DP should not be limited to the organic light emitting display panel. That is, the flexible display panel DP may be a liquid crystal display panel, a plasma display panel, an electrophoretic display panel, a microelectromechanical system display panel, or an electrowetting display panel.

Referring to FIGS. 1A to 1C, 5A to 5C, 6A, and 6B, the flexible display panel DP includes the conductive pattern CP disposed on the flexible substrate FB. At least a portion of the conductive pattern CP is included in the panel bending part BF1. The conductive pattern CP may be included in the panel bending part BF1 and may not be included in the panel non-bending part NBF1. The conductive pattern CP may be included in each of the panel bending part BF1 and the panel non-bending part NBF1. The conductive pattern CP has a grain size of about 10 nm to about 100 nm. The conductive pattern CP includes the conductive pattern layers CPL (refer to FIG. 2B) each having the grain size of about 10 nm to about 100 nm.

The conductive pattern CP includes gate lines GL, data lines DL, driving voltage lines DVL, a switching thin film transistor TFT1, a driving thin film transistor TFT2, a capacitor Cst, a first semiconductor pattern SM1, a second semiconductor pattern SM2, a first electrode EL1, and a second electrode EL2. The switching thin film transistor TFT1 includes a first gate electrode GE1, a first source electrode SE1, and a first drain electrode DE1. The driving thin film transistor TFT2 includes a second gate electrode GE2, a second source electrode SE2, and a second drain electrode DE2. The capacitor Cst includes a first common electrode CE1 and a second common electrode CE2.

Referring to FIGS. 6A and 6B, each pixel PX is connected to a line part including the gate lines GL, the data lines DL, and the driving voltage lines DVL. Each pixel PX includes the thin film transistors TFT1 and TFT2 connected to the line part and an organic light emitting element OEL connected to the thin film transistors TFT1 and TFT2, and the capacitor Cst.

In the present exemplary embodiment, one pixel is connected to one gate line, one data line, and one driving voltage line, but it should not be limited thereto or thereby. That is, a plurality of pixels may be connected to one gate line, one data line, and one driving voltage line. In addition, one pixel may be connected to at least one gate line, at least one data line, and at least one driving voltage line.

The gate lines GL extend in a third direction DR3. The data lines DL extend in a fourth direction DR4 to cross the gate lines GL. The driving voltage lines DVL extend in the fourth direction DR4. The gate lines GL apply scan signals to the thin film transistors TFT1 and TFT2, the data lines DL apply data signals to the thin film transistors TFT1 and TFT2, and the driving voltage lines DVL apply driving voltages to the thin film transistors TFT1 and TFT2.

At least one of the gate lines GL, the data lines DL, and the driving voltage lines DVL may have a grain size of about 10 nm to about 100 nm. At least one of the gate lines GL, the data lines DL, and the driving voltage lines DVL may include a plurality of layers, each having the grain size of about 10 nm to about 100 nm. Each of the layers included in at least one of the gate lines GL, the data lines DL, and the driving voltage lines DVL may have a thickness of about 10 nm to about 150 nm.

Each of the pixels PX emits a light with a specific color, e.g., a red light, a green light, or a blue light, but the color of the light should not be limited thereto or thereby. For instance, each pixel may emit a white color, a cyan light, a magenta light, or a yellow light.

The thin film transistors TFT1 and TFT2 includes the driving thin film transistor TFT2 to control the organic light emitting element OEL and the switching thin film transistor TFT1 to switch the driving thin film transistor TFT2. In the present exemplary embodiment, each pixel PX includes two thin film transistors TFT1 and TFT2, but it should not be limited thereto or thereby. That is, each pixel PX may include one thin film transistor and a capacitor or may include three or more thin film transistors and two or more capacitors.

At least one of the switching thin film transistor TFT1, the driving thin film transistor TFT2, and the capacitor Cst may have a grain size of about 10 nm to about 100 nm. At least one of the switching thin film transistor TFT1, the driving thin film transistor TFT2, and the capacitor Cst may include a plurality of layers, each having the grain size of about 10 nm to about 100 nm. Each of the layers included in at least one of the switching thin film transistor TFT1, the driving thin film transistor TFT2, and the capacitor Cst may have a thickness of about 10 nm to about 150 nm.

The switching thin film transistor TFT1 includes the first gate electrode GE1, the first source electrode SE1, and the first drain electrode DE1. The first gate electrode GE1 is connected to the gate lines GL and the first source electrode SE1 is connected to the data lines DL. The first drain electrode DE1 is connected to a first common electrode CE1 through a fifth contact hole CH5. The switching thin film transistor TFT1 applies the data signal provided through the data lines DL to the driving thin film transistor TFT2 in response to the scan signal provided through the gate lines GL.

At least one of the first gate electrode GE1, the first source electrode SE1, and the first drain electrode DE1 may have a grain size of about 10 nm to about 100 nm. At least one of the first gate electrode GE1, the first source electrode SE1, and the first drain electrode DE1 may include a plurality of layers, each having a grain size of about 10 nm to about 100 nm. Each of the layers included in at least one of the first gate electrode GE1, the first source electrode SE1, and the first drain electrode DE1 may have a thickness of about 10 nm to about 150 nm.

The driving thin film transistor TFT2 includes the second gate electrode GE2, the second source electrode SE2, and the second drain electrode DE2. The second gate electrode GE2 is connected to the first common electrode CE1. The second source electrode SE2 is connected to the driving voltage lines DVL. The second drain electrode DE2 is connected to the first electrode EL1 through a third contact hole CH3.

At least one of the second gate electrode GE2, the second source electrode SE2, and the second drain electrode DE2 may have a grain size of about 10 nm to about 100 nm. At least one of the second gate electrode GE2, the second source electrode SE2, and the second drain electrode DE2 may include a plurality of layers, each having a grain size of about 10 nm to about 100 nm. Each of the layers included in at least one of the second gate electrode GE2, the second source electrode SE2, and the second drain electrode DE2 may have a thickness of about 10 nm to about 150 nm.

The first electrode EL1 is connected to the second drain electrode DE2 of the driving thin film transistor TFT2. The second electrode is applied with a common voltage and a light emitting layer EML emits the light in response to an output signal from the driving thin film transistor TFT2 to display an image. The first and second electrodes EL1 and EL2 will be described in detail later.

The capacitor Cst is connected between the second gate electrode GE2 and the second source electrode SE2 of the driving thin film transistor TFT2 and is charged with the data signal applied to the second gate electrode GE2 of the driving thin film transistor TFT2. The capacitor Cst includes a first common electrode CE1 connected to the first drain electrode DE1 through a sixth contact hole CH6 and a second common electrode CE2 connected to the driving voltage lines DVL.

At least one of the first common electrode CE1 and the second common electrode CE2 may have a grain size of about 10 nm to about 100 nm. At least one of the first common electrode CE1 and the second common electrode CE2 may include a plurality of layers, each having the grain size of about 10 nm to about 100 nm. Each of the layers included in at least one of the first common electrode CE1 and the second common electrode CE2 may have a thickness of about 10 nm to about 150 nm.

Referring to FIGS. 6A to 6C, a first flexible substrate FB1 may include, but not limited to, a plastic material or an organic polymer, e.g., polyethylene (PET), polyethylene naphthalate (PEN), polyimide, polyether sulfone, etc. The material for the first flexible substrate FB1 is selected in consideration of mechanical strength, thermal stability, transparency, surface smoothness, ease of handling, water repellency, etc. The first flexible substrate FB may be transparent.

A substrate buffer layer (not shown) may be disposed on the first flexible substrate FB1. The substrate buffer layer prevents impurities from being diffused into the switching thin film transistor TFT1 and the driving thin film transistor TFT2. The substrate buffer layer may be formed of silicon nitride ($SiN_x$), silicon oxide ($SiO_x$), or silicon oxynitride ($SiO_xN_y$) and omitted depending on material and process condition of the first flexible substrate FB1.

A first semiconductor pattern SM1 and a second semiconductor pattern SM2 are disposed on the first flexible substrate FB1. The first and second semiconductor patterns SM1 and SM2 are formed of a semiconductor material and operated as active layers of the switching thin film transistor TFT1 and the driving thin film transistor TFT2, respectively. Each of the first and second semiconductor patterns SM1 and SM2 includes a source part SA, a drain part DA, and a channel part CA disposed between the source part SA and the drain part DA. Each of the first and second semiconductor patterns SM1 and SM2 is formed of an inorganic semiconductor or an organic semiconductor. The source part SA and the drain part DA are doped with an n-type impurity or a p-type impurity.

At least one of the first semiconductor pattern SM1 and the second semiconductor pattern SM2 may have a grain size of about 10 nm to about 100 nm. At least one of the first semiconductor pattern SM1 and the second semiconductor pattern SM2 may include a plurality of layers, each having a grain size of about 10 nm to about 100 nm. Each of the layers included in at least one of the first semiconductor pattern SM1 and the second semiconductor pattern SM2 may have a thickness of about 10 nm to about 150 nm.

A gate insulating layer GI is disposed on the first and second semiconductor patterns SM1 and SM2. The gate insulating layer GI covers the first and second semiconductor patterns SM1 and SM2. The gate insulating layer GI includes an organic insulating material or an inorganic insulating material.

The first and second gate electrodes GE1 and GE2 are disposed on the gate insulating layer GI. The first and second gate electrodes GE1 and GE2 are disposed to respectively cover portions corresponding to the drain parts DA of the first and second semiconductor patterns SM1 and SM2.

A first insulating layer IL1 is disposed on the first and second gate electrodes GE1 and GE2. The first insulating layer IL1 covers the first and second gate electrodes GE1 and GE2. The first insulating layer IL1 includes an organic insulating material or an inorganic insulating material.

The first source electrode SE1, the first drain electrode DE1, the second source electrode SE2, and the second drain electrode DE2 are disposed on the first insulating layer IL1. The second drain electrode DE2 makes contact with the drain part DA of the second semiconductor pattern SM2 through a first contact hole CH1 formed through the gate insulating layer GI and the first insulating layer ILL and the second source electrode SE2 makes contact with the source part SA of the second semiconductor pattern SM2 through a second contact hole CH2 formed through the gate insulating layer GI and the first insulating layer IL1. The first source electrode SE1 makes contact with the source part (not shown) of the first semiconductor pattern SM1 through a fourth contact hole CH4 formed through the gate insulating layer GI and the first insulating layer IL1 and the first drain electrode DE1 makes contact with the drain part (not shown) of the first semiconductor pattern SM1 through a fifth contact hole CH5 formed through the gate insulating layer GI and the first insulating layer IL1.

A passivation layer PL is disposed on the first source electrode SE1, the first drain electrode DE1, the second source electrode SE2, and the drain electrode DE2. The passivation layer PL serves as a protective layer to protect the switching thin film transistor TFT1 and the driving thin film transistor TFT2 or as a planarization layer to planarize an upper surface of the switching thin film transistor TFT1 and the driving thin film transistor TFT2.

The first electrode EL1 is disposed on the passivation layer PL. The first electrode EL1 may be a positive electrode. The first electrode EL1 is connected to the second drain electrode DE2 of the driving thin film transistor TR2 through a third contact hole CH3 formed through the passivation layer PL.

A pixel definition layer PDL is disposed on the passivation layer PL to divide the light emitting layer EML to correspond to each of the pixel PX. The pixel definition layer PDL exposes an upper surface of the first electrode EL1 and is protruded from the first flexible substrate FB1. The pixel definition layer PDL may include, but is not limited to, metal-fluoride ionic compounds, e.g., LiF, $BaF_2$, CsF. The metal-fluoride ionic compounds may have an insulating property when the metal-fluoride ionic compounds have a predetermined thickness. The pixel definition layer PDL has a thickness of about 10 nm to abut 100 nm. The pixel definition layer PDL will be described in detail later.

The organic light emitting element OEL is provided in the area surrounding by the pixel definition layer PDL. The organic light emitting layer OEL includes the first electrode EL1, a hole transport region HTR, the light emitting layer EML, an electron transport region ETR, and the second electrode EL2.

The first electrode EL1 has conductivity. The first electrode EL1 may be a pixel electrode or a positive electrode. The first electrode EL1 has a grain size of about 10 nm to about 100 nm. The first electrode EL1 may include a plurality of layers, each having a grain size of about 10 nm to about 100 nm. Each of the layers included in the first electrode EL1 may have a thickness of about 10 nm to about 150 nm.

The first electrode EL1 may be a transmissive electrode, a transflective electrode, or a reflective electrode. When the first electrode EL1 is the transmissive electrode, the first electrode EL1 includes a transparent metal oxide, e.g., indium tin oxide (ITO), indium zinc oxide (IZO), zinc oxide (ZnO), indium tin zinc oxide (ITZO), etc. When the first electrode EL1 is the transflective electrode or the reflective electrode, the first electrode EL1 includes at least one of Al, Cu, Ti, Mo, Ag, Mg, Pt, Pd, Au, Ni, Nd, Ir, and Cr.

An organic layer is disposed on the first electrode EL1. The organic layer includes the light emitting layer EML. The organic layer may further include the hole transport region HTR and the electrode transport region ETR.

The hole transport region HTR is disposed on the first electrode EL1. The hole transport region HTR includes at least one of a hole injection layer, a hole transport layer, a buffer layer, and an electron block layer.

The hole transport region HTR has a single-layer structure of a single material, a single-layer structure of different materials, or a multi-layer structure of plural layers of different materials.

For instance, the hole transport region HTR may have a structure in which single is layers formed of different materials from each other are stacked one on another or a structure of the hole injection layer/the hole transport layer, the hole injection layer/the hole transport layer/the buffer layer, the hole injection layer/the buffer layer, the hole transport layer/the buffer layer, or the hole injection layer/the hole transport layer/the electron block layer.

The hole transport region HTR may be formed using various methods, e.g., a vacuum deposition method, a spin coating method, a casting method, a Langmuir-Blodgett method, an inkjet printing method, a laser printing method, a laser induced thermal image (LITI) method, etc.

When the hole transport region HTR includes the hole injection layer, the hole transport region HTR may include, but not limited to, a phthalocyanine compound such as copper phthalocyanine, DNTPD (N,N'-diphenyl-N,N'-bis-[4-(phenyl-m-tolyl-amino)-phenyl]-biphenyl-4,4'-diamine), m-MTDATA(4,4',4"-tris(3-methylphenylphenylamino)triphenylamine), TDATA(4,4'4"-Tris(N,N-diphenylamino)triphenylamine), 2TNATA(4,4',4"-tri{N,-(2-naphthyl)-N-phenylamino}-triphenylamine), PEDOT/PSS(Poly(3,4-ethylenedioxythiophene)/Poly(4-styrenesulfonate), PANI/DBSA(Polyaniline/Dodecylbenzenesulfonic acid), PANI/CSA(Polyaniline/Camphor sulfonicacid), PANI/PSS ((Polyaniline)/Poly(4-styrenesulfonate), etc.

When the hole transport region HTR includes the hole transport layer, the hole transport region HTR may include, but not limited to, carbazole-based derivatives, e.g., n-phenyl carbazole, polyvinyl carbazole, etc., fluorine-based derivatives. triphenylamine-based derivatives, e.g. TPD(N, N'-bis(3-methylphenyl)-N,N'-diphenyl[1,1-biphenyl]-4,4'-diamine), TCTA(4,4',4"-tris(N-carbazolyl)triphenylamine), etc., NPB(N,N'-di(1-naphthyl)-N,N'-diphenylbenzidine), TAPC(4,4'-Cyclohexylidene bis[N,N-bis(4-methylphenyl)benzenamine]), etc.

The hole transport region HTR may further include an electric charge generating material. The electric charge generating material may be uniformly or non-uniformly distributed in the hole transport region HTR. The electric charge generating material may be, but not limited to, a p-dopant. The p-dopant may be one of a quinone derivative, a metal oxide material, and a compound containing a cyano group, but it should not be limited thereto or thereby. For instance, the p-dopant may include the quinone derivatives, such as TCNQ(Tetracyanoquinodimethane), F4-TCNQ(2,3,5,6-tetrafluoro-tetracyanoquinodimethane), etc., or the metal oxide material, such as a tungsten oxide material, a molybdenum oxide material, etc., but it should not be limited thereto or thereby.

The light emitting layer EML is disposed on the hole transport region HTR. The light emitting layer EML includes a light emitting material with red, green, and blue colors and includes a fluorescence material or a phosphorescent material. In addition, the light emitting layer EML includes a host and a dopant.

As the host, for example, Alq3(tris(8-hydroxyquinolino) aluminum), CBP(4,4'-bis(N-carbazolyl)-1,1'-biphenyl), PVK(poly(n-vinylcabazole), ADN(9,10-di(naphthalene-2-yl)anthracene), TCTA(4,4',4"-Tris(carbazol-9-yl)-triphenylamine), TPBi(1,3,5-tris(N-phenylbenzimidazole-2-yl) benzene), TBADN(3-tert-butyl-9,10-di(naphth-2-yl) anthracene), DSA(distyrylarylene), CDBP(4,4'-bis(9-carbazolyl)-2,2"-dimethyl-biphenyl), MADN(2-Methyl-9,10-bis(naphthalen-2-yl)anthracene) may be used, however, it should not be limited thereto or thereby.

When the light emitting layer EML emits light having a red color, the light emitting layer EML, for example, may include the fluorescent material including PBD:Eu(DBM)3 (Phen)(tris(dibenzoylmethanato)phenanthoroline europium) or perylene. When the light emitting layer EML emits light having a red color, the light emitting layer EML, the host included in the light emitting layer EML may be selected from a metal complex, such as PIQIr(acac)(bis(1-phenylisoquinoline)acetylacetonate iridium), PQIr(acac)(bis(1-phenylquinoline)acetylacetonate iridium), PQIr(tris(1-phenylquinoline)iridium), PtOEP(octaethylporphyrin platinum), etc., or organometallic complex.

When the light emitting layer EML emits light having a green color, the light emitting layer EML, for example, may include the fluorescent material including Alq3(tris(8-hydroxyquinolino)aluminum). When the light emitting layer EML emits light having a green color, the light emitting layer EML, the host included in the light emitting layer EML may be selected from a metal complex, such as Ir(ppy)3 (fac-tris(2-phenylpyridine)iridium), or organometallic complex.

When the light emitting layer EML emits light having a blue color, the light emitting layer EML, for example, may include the fluorescent material including any one selected from the groups consisting of spiro-DPVBi, spiro-6P, DSB (distyryl-benzene), DSA(distyryl-arylene), PFO(Polyfluorene)-based polymer, and PPV(poly(p-phenylene vinylene)-based polymer. When the light emitting layer EML emits light having a blue color, the light emitting layer EML, the host included in the light emitting layer EML may be selected from a metal complex, such as (4,6-F2ppy)2Irpic, or organometallic complex. The light emitting layer EML will be described in detail later.

The electron transport region ETR is disposed on the light emitting layer EML. The electron transport region ETR includes at least one of a hole block layer, an electron transport layer, and an electron injection layer, but it should not be limited thereto or thereby.

When the electron transport region ETR includes the electron transport layer, the electron transport region ETR includes Alq3(Tris(8-hydroxyquinolinato)aluminum), TPBi (1,3,5-Tri(1-phenyl-1H-benzo[d]imidazol-2-yl)phenyl), BCP(2,9-Dimethyl-4,7-diphenyl-1,10-phenanthroline), Bphen(4,7-Diphenyl-1,10-phenanthroline), TAZ(3-(4-Biphenylyl)-4-phenyl-5-tert-butylphenyl-1,2,4-triazole), NTAZ(4-(Naphthalen-1-yl)-3,5-diphenyl-4H-1,2,4-triazole), tBu-PBD(2-(4-Biphenylyl)-5-(4-tert-butylphenyl)-1,3,4-oxadiazole), BAlq(Bis(2-methyl-8-quinolinolato-N1,O8)-(1,1'-Biphenyl-4-olato)aluminum), Bebq2(berylliumbis (benzoquinolin-10-olate), ADN(9,10-di(naphthalene-2-yl) anthracene), or a compound thereof. The electron transport layer has a thickness of about 100 angstroms to about 1000 angstroms, and may have a thickness of about 150 angstroms to about 500 angstroms. When the thickness of the electron transport layer is in the above-mentioned range of about 100 angstroms to about 1000 angstroms, satisfactory electron transport property may be secured without increasing the driving voltage.

When the electron transport region ETR includes the electron injection layer, the electron transport region ETR includes a lanthanide-based metal, e.g., LiF, LiQ (Lithium quinolate), Li$_2$O, BaO, NaCl, CsF, Yb, etc., or a metal halide, e.g., RbCl, RbI, etc., but it should not be limited thereto or thereby. The electron transport layer may include a mixture of an electron transport material and an organo metal salt with insulating property. The organo metal salt has an energy band gap of about 4 eV or more. In detail, the organo metal salt may include metal acetate, metal benzoate, metal acetoacetate, metal acetylacetonate, or metal stearate. The electron injection layer has a thickness of about 1 angstroms to about 100 angstroms, and may have a thickness of about 3 angstroms to about 90 angstroms. When the thickness of the electron injection layer is in the abovementioned range of about 1 angstroms to about 100 angstroms, satisfactory electron injection property may be secured without increasing the driving voltage.

As described above, the electron transport region ETR includes the hole block layer. The hole block layer include at least one of BCP(2,9-dimethyl-4,7-diphenyl-1,10-phenanthroline) and Bphen(4,7-diphenyl-1,10-phenanthroline), but it should not be limited thereto or thereby.

The second electrode EL2 is disposed on the electron transport region ETR. The second EL2 may be a common electrode or a negative electrode. The second electrode EL2 has a grain size of about 10 nm to about 100 nm. The second electrode EL2 may include a plurality of layers, each having a grain size of about 10 nm to about 100 nm. Each of the layers included in the first electrode EL1 may have a thickness of about 10 nm to about 150 nm.

The second electrode EL2 may be a transmissive electrode, a transflective electrode, or a reflective electrode. When the second electrode EL2 is the transmissive electrode, the second electrode EL2 includes Li, Ca, LiF/Ca, LiF/Al, Al, Mg, BaF, Ba, Ag, a compound thereof, or a mixture thereof, e.g., a mixture of Ag and Mg.

The second electrode EL2 may include an auxiliary electrode. The auxiliary electrode includes a layer obtained by depositing the material to face the light emitting layer EML and a transparent metal oxide disposed on the layer, such as indium tin oxide, indium zinc oxide, zinc oxide, indium tin zinc oxide, Mo, Ti, etc.

When the second electrode EL2 is the transflective electrode or the reflective electrode, the second electrode EL2 includes Ag, Mg, Cu, Al, Pt, Au, Ni, Nd, Ir, Cr, Li, Ca, LiF/Ca, LiF/Al, Mo, Ti, a compound thereof, or a mixture thereof, e.g., a mixture of Ag and Mg. In addition, the second electrode EL2 has a multi-layer structure of a reflective layer or a transflective layer formed of the above-mentioned material and a transparent conductive layer formed of indium tin oxide, indium zinc oxide, zinc oxide, or indium tin zinc oxide.

When the organic light emitting element OEL is a front surface light emitting type, the first electrode EL1 is the reflective electrode and the second electrode EL2 is the transmissive or transflective electrode. When the organic light emitting element OEL is a rear surface light emitting type, the first electrode EL1 is the transmissive or transflective electrode and the second electrode EL2 is the reflective electrode.

When voltages are respectively applied to the first and second electrodes EL1 and EL2, holes injected from the first electrode EL1 move to the light emitting layer EML through the hole transport region HTR and electrons injected from the second electrode EL2 move to the light emitting layer EML through the electron transport region ETR. The holes and electrons are recombined in the light emitting layer EML to generate excitons, and the organic light emitting element OEL emits the light by the excitons that return to a ground state from an excited state.

A sealing layer SL is disposed on the second electrode EL2. The sealing layer SL covers the second electrode EL2. The sealing layer SL includes at least one of an organic layer and an inorganic layer. The sealing layer SL is a thin sealing layer. The sealing layer SL protects the organic light emitting element OEL.

Figure 7A:
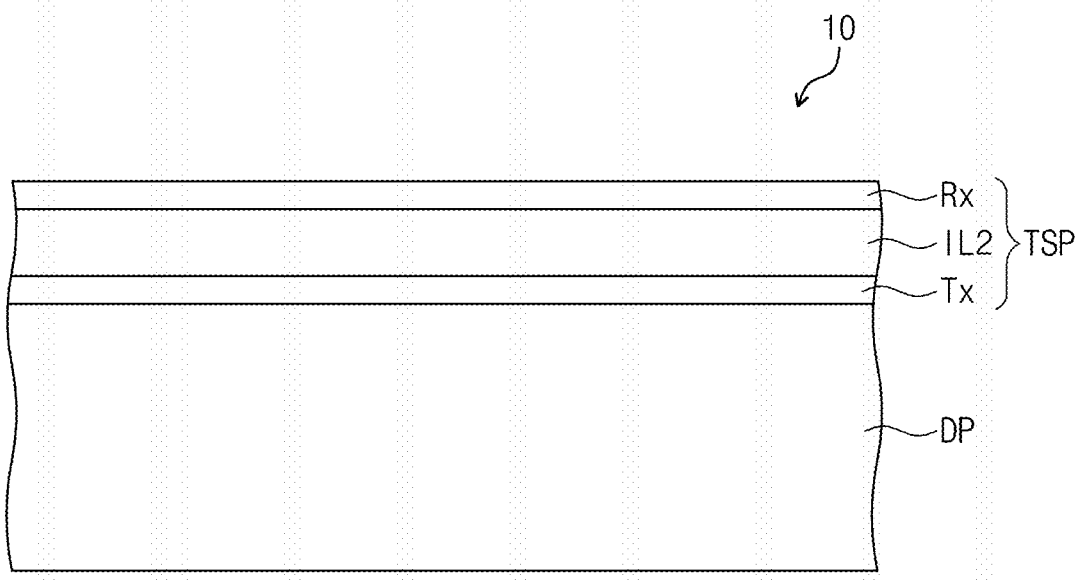
FIG. 7A is a cross-sectional view showing a flexible display device according to an exemplary embodiment of the present disclosure.
Figure 7B:
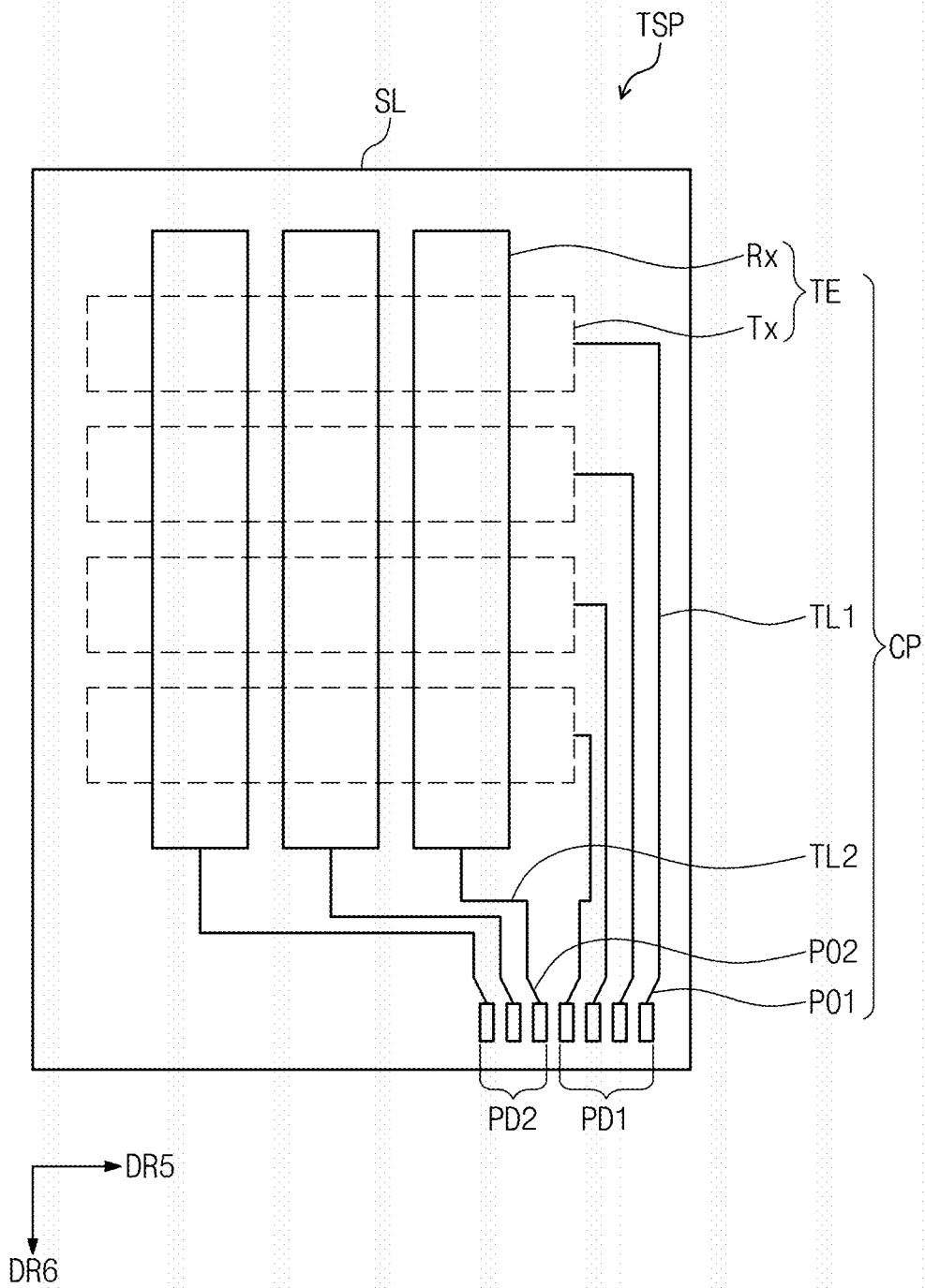
FIG. 7B is a plan view showing a touch screen panel included in a flexible display device according to an exemplary embodiment of the present disclosure.

FIG. 7A is a cross-sectional view showing a flexible display device according to an exemplary embodiment of the present disclosure and FIG. 7B is a plan view showing a touch screen panel included in a flexible display device according to an exemplary embodiment of the present disclosure.

Figure 8A:
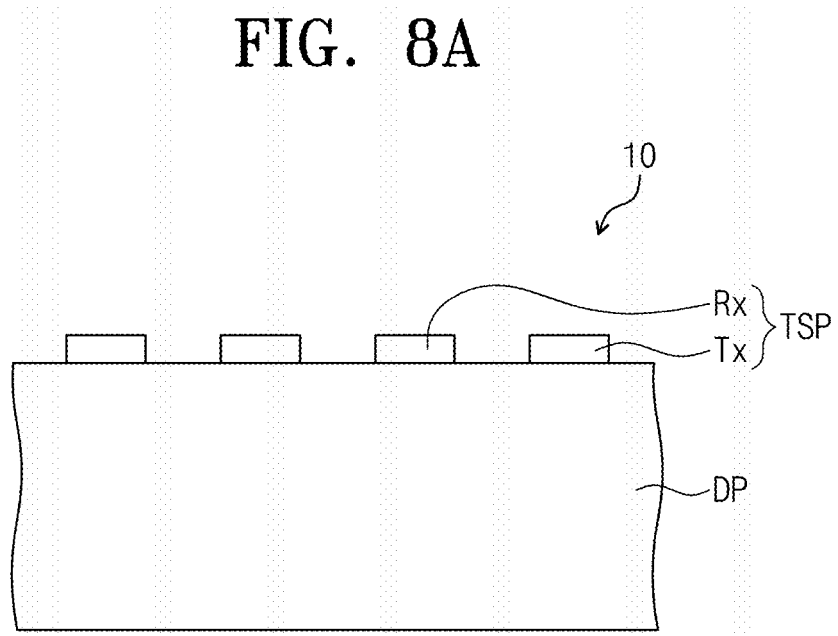
FIG. 8A is a plan view showing a flexible display device according to an exemplary embodiment of the present disclosure.
Figure 8B:
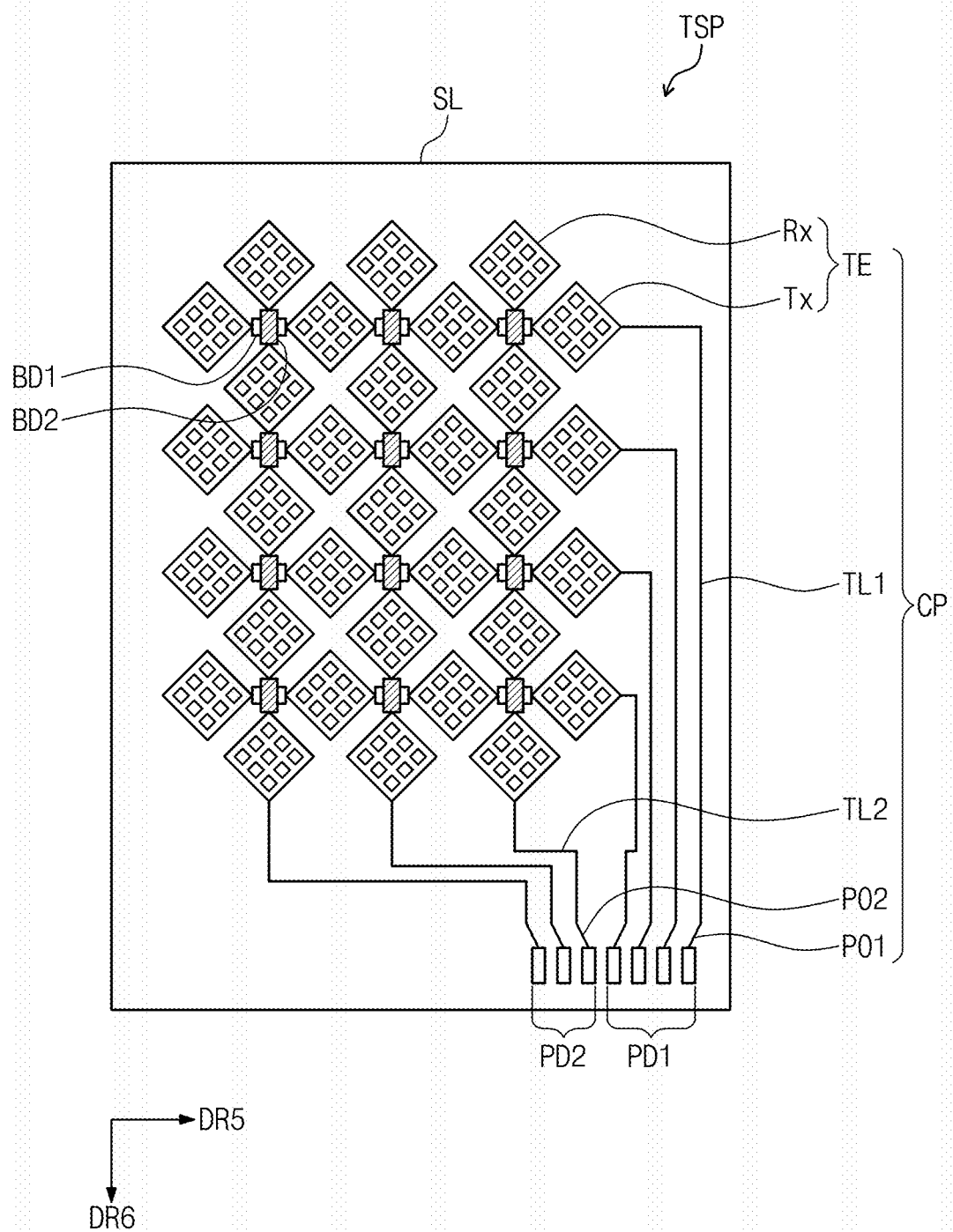
FIG. 8B is a plan view showing a touch screen panel included in a flexible display device according to an exemplary embodiment of the present disclosure.

FIG. 8A is a plan view showing a flexible display device according to an exemplary embodiment of the present disclosure and FIG. 8B is a plan view showing a touch screen panel included in a flexible display device according to an exemplary embodiment of the present disclosure.

Referring to FIGS. 7A, 7B, 8A, and 8B, the touch screen panel TSP is disposed on the flexible display panel DP. The touch screen panel TSP may be disposed on the sealing layer SL (refer to FIG. 6C). The touch screen panel TSP recognizes a user's direct touch, a user's indirect touch, an object's direct touch, or an object's indirect touch. The term of "indirect touch" used herein means that the touch screen panel TSP recognizes the touches even though the touch screen panel TSP is not actually touched by the user or object since the user or object is spaced apart from the touch screen panel TSP by a distance, in which the touch screen panel TSP recognizes the touch of the user or object.

When the direct or indirect touch occurs, a variation in electrostatic capacitance occurs between first sensing electrodes Tx and second sensing electrodes Rx included in a sensing electrode TE. A sensing signal applied to the first sensing electrodes Tx is delayed due to the variation of the electrostatic capacitance and then applied to the second sensing electrodes Rx. The touch screen panel TSP generates a touch coordinate from the delay value of the sensing signal.

In the present exemplary embodiment, the touch screen panel TSP is operated in an electrostatic capacitive mode, but it should not be limited thereto or thereby. That is, the touch screen panel TSP may be operated in a resistive film mode, a self cap mode, or a mutual cap mode.

Referring to FIGS. 1A to 1C, FIGS. 5A to 5C, and FIGS. 7A, 7B, 8A, and 8B, at least the portion of the conductive pattern CP is included in the touch bending part BF2. The conductive pattern CP may be included in the touch bending part BF2 and may not be included in the touch non-bending part NBF2. The conductive pattern CP may be included in each of the touch bending part BF2 and the touch non-bending part NBF2. The conductive pattern CP has a grain size of about 10 nm to about 100 nm. The conductive pattern CP includes the conductive pattern layers CPL (refer to FIG. 2B), each having a grain size of about 10 nm to about 100 nm.

The conductive pattern CP includes a sensing electrode TE, a first connection line TL1, a second connection line TL2, a first fanout line PO1, a second fanout line PO2, a first bridge BD1, and a second bridge BD2, which will be described in detail later.

Referring to FIGS. 7A, 7B, 8A, and 8B, the sensing electrode TE is disposed on the sealing layer SL. Although not shown in the figures, an additional flexible substrate may be disposed between the sensing electrode TE and the sealing layer SL. The sensing electrode has a grain size of about 10 nm to about 100 nm.

The sensing electrode TE includes the first sensing electrodes Tx and the second sensing electrodes Rx. The first sensing electrodes Tx are electrically connected to each other and the second sensing electrodes Rx are electrically connected to each other. Each of the first and second sensing electrodes Tx and Rx has a substantially lozenge, square, rectangular, or circular shape, or an atypical shape, e.g., a dendrite structure. Each of the first and second sensing electrodes Tx and Rx has a mesh structure.

Referring to FIGS. 7A and 7B, the first sensing electrodes Tx are disposed on a layer different from a layer on which the second sensing electrodes Rx are disposed. For instance, the first sensing electrodes Tx are disposed on the sealing layer SL and an insulating layer IL2 is disposed on the first sensing electrodes Tx. The second sensing electrodes Rx are disposed above the first sensing electrodes Tx.

The first sensing electrodes Tx extend in a fifth direction DR5 and are arranged to be spaced apart from each other in a sixth direction DR6. The second sensing electrodes Rx extend in the sixth direction DR6 and are arranged to be spaced apart from each other in the fifth direction DR5.

Referring to FIGS. 8A and 8B, the first and second sensing electrodes Tx and Rx may be disposed on the same layer. The first and second sensing electrodes Tx and Rx are disposed on the sealing layer SL. The first sensing electrodes Tx are arranged in the fifth and sixth directions DR5 and DR6 and spaced apart from each other.

The first sensing electrodes Tx spaced apart from each other in the fifth direction DR5 are connected to each other by the first bridge BD1. The second sensing electrodes Rx are arranged in the fifth and sixth directions DR5 and DR6 and spaced apart from each other. The second sensing electrodes Rx spaced apart from each other in the sixth direction DR6 are connected to each other by the second bridge BD2. The second bridge BD2 is disposed on the first bridge BD1. Although not shown in the figures, an insulating layer may be disposed between the first bridge BD1 and the second bridge BD2.

Each of the first and second bridges BD1 and BD2 has a grain size of about 10 nm to about 100 nm. Each of the first and second bridges BD1 and BD2 includes a plurality of layers, each having a grain size of about 10 nm to about 100 nm. Each of the layers included in each of the first and second bridges BD1 and BD2 has a thickness of about 10 nm to about 150 nm.

The connection lines TL1 and TL2 are electrically connected to the sensing electrode TE. The connection lines TL1 and TL2 have a grain size of about 10 nm to about 100 nm.

The connection lines TL1 and TL2 included first connection lines TL1 and second connection lines TL2. The first connection lines TL1 are connected to the first sensing electrodes Tx and first fanout lines PO1. The second connection lines TL2 are connected to the second sensing electrodes Rx and second fanout lines PO2.

The fanout lines PO1 and PO2 are connected to the connection lines TL1 and TL2 and pad parts PD1 and PD2. The fanout lines PO1 and PO2 include the first fanout lines PO1 and second fanout lines PO2. The first fanout lines PO1 are connected to the first connection lines TL1 and the first pad part PD1. The second fanout lines PO2 are connected to the second connection lines TL2 and the second pad part PD2.

The first and second pad parts PD1 and PD2 are electrically connected to the sensing electrode TE. The first and second pad parts PD1 and PD2 have a grain size of about 10 nm to about 100 nm. The first and second pad parts PD1 and PD2 include a plurality of layers, each having a grain size of about 10 nm to about 100 nm. Each of the layers included in the first and second pad parts PD1 and PD2 has a thickness of about 10 nm to about 150 nm.

The pad parts PD1 and PD2 include the first pad part PD1 and the second pad part PD2. The first pad part PD1 is connected to the first fanout lines PO1. The first pad part PD1 is electrically connected to the first sensing electrodes Tx. The second pad part PD2 is connected to the second fanout lines PO2. The second pad part PD2 is electrically connected to the second sensing electrodes Rx.

Figure 9A:
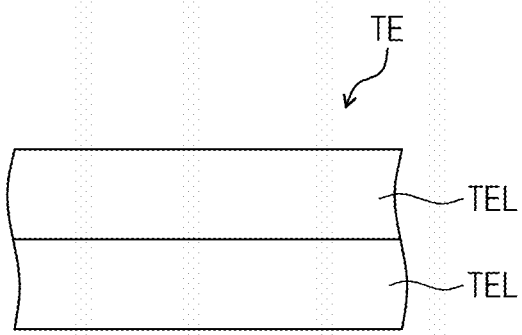
FIG. 9A is a cross-sectional view showing a sensing electrode included in a touch screen panel according to an exemplary embodiment of the present disclosure.

FIG. 9A is a cross-sectional view showing the sensing electrode TE included in a touch screen panel according to an exemplary embodiment of the present disclosure.

Referring to FIG. 9A, the sensing electrode TE includes a plurality of sensing electrode layers TEL. The sensing electrode TE includes two, three, four, five, or six sensing electrode layers TEL, but it should not be limited thereto or thereby. The sensing electrode TE may include seven or more sensing electrode layers TEL. An air layer (not shown) may be provided between the sensing electrode layers TEL.

Each of the sensing electrode layers TEL has a grain size of about 10 nm to about 100 nm. When the grain size of the sensing electrode layers TEL is less than about 10 nm, a resistance of the sensing electrode layers TEL increases, and thus, power consumption required to drive the flexible display device 10 (refer to FIG. 5A) increases. When the grain size of the sensing electrode layers TEL is greater than about 100 nm, it is difficult to secure flexibility of the bending of the sensing electrode layers TEL since the grain size is excessively large. As a result, a crack or a disconnection occurs in the sensing electrode layers TEL, and reliability of the sensing electrode layers TEL is reduced.

Each of the sensing electrode layers TEL has a thickness of about 10 nm to abut 150 nm. When the thickness of each of the sensing electrode layers TEL is less than about 10 nm, the number of interfaces of the sensing electrode layers TEL increases even though the overall thickness of the sensing electrode TE is not increased, and thus, the resistance of the sensing electrode TE increases. Accordingly, power consumption required to drive the flexible display device 10 (refer to FIG. 5A) increases. In addition, the reliability of the sensing electrode layers TEL may be reduced when each sensing electrode layer TEL is manufactured or provided. When the thickness of each of the sensing electrode layers TEL exceeds about 150 nm, it is difficult to secure flexibility of the sensing electrode layers TEL when the sensing electrode layers TEL are bent. As a result, a crack or a disconnection occurs in the sensing electrode layers TEL and reliability of the sensing electrode layers TEL is reduced.

Each of the sensing electrode layers TEL may include at least one of a metal, a metal alloy, and a transparent conductive oxide, but it should not be limited thereto or thereby.

The metal may include, but not limited to, at least one of Al, Cu, Ti, Mo, Ag, Mg, Pt, Pd, Au, Ni, Nd, Ir, and Cr.

The transparent conductive oxide may include, but not limited to, at least one of indium tin oxide (ITO), indium zinc oxide (IZO), zinc oxide (ZnO), and indium tin zinc oxide (ITZO).

Figure 9B:
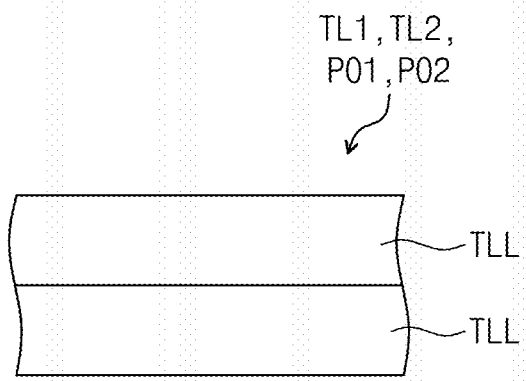
FIG. 9B is a cross-sectional view showing a line included in a touch screen panel according to an exemplary embodiment of the present disclosure.

FIG. 9B is a cross-sectional view showing lines included in the touch screen panel according to an exemplary embodiment of the present disclosure.

Referring to FIG. 9B, the lines TL1, TL2, PO1, and PO2 include a plurality of line layers TLL. The lines TL1, TL2, PO1, and PO2 include two, three, four, fifth, or sixth line layers TLL, but they should not be limited thereto or thereby. The lines TL1, TL2, PO1, and PO2 may include seven or more line layers TLL. An air layer (not shown) may be provided between the line layers TLL.

Each of the line layers TLL has a grain size of about 10 nm to about 100 nm. When the grain size of the line layers TLL is less than about 10 nm, a resistance of the line layers TLL increases, and thus, power consumption required to drive the flexible display device 10 (refer to FIG. 5A) increases. When the grain size of the line layers TLL is greater than about 100 nm, it is difficult to secure flexibility of the bending of the line layers TLL since the grain size is too large. As a result, a crack or a disconnection occurs in the line layers TLL and reliability of the line layers TLL is reduced.

Each of the line layers TLL has a thickness of about 10 nm to abut 150 nm. When the thickness of each of the line layers TLL is less than about 10 nm, the number of interfaces of the line layers TLL increases even though the overall thickness of the lines TL1, TL2, PO1, and PO2 is not increased, and thus, the resistance of the lines TL1, TL2, PO1, and PO2 increases. Accordingly, power consumption required to drive the flexible display device 10 (refer to FIG. 5A) increases. In addition, the reliability of the line layers TLL may be reduced when each line layer TLL is manufactured or provided. When the thickness of each of the line layers TLL is greater than about 150 nm, it is difficult to secure flexibility of the line layers TLL when the line layers TLL are bent. As a result, a crack or a disconnection occurs in the line layers TLL and reliability of the line layers TLL is reduced.

Each of the line layers TLL may include at least one of a metal, a metal alloy, and a transparent conductive oxide, but it should not be limited thereto or thereby.

The metal may include, but not limited to, at least one of Al, Cu, Ti, Mo, Ag, Mg, Pt, Pd, Au, Ni, Nd, Ir, and Cr.

The transparent conductive oxide may include, but not limited to, at least one of indium tin oxide (ITO), indium zinc oxide (IZO), zinc oxide (ZnO), and indium tin zinc oxide (ITZO).

A conductive pattern included in a conventional flexible display device has a grain size greater than that of the conductive pattern according to the present exemplary embodiment, and thus, it is difficult to secure the flexibility of the bending of the flexible display device. Accordingly, when the conventional flexible display device is repeatedly bent or unbent, the crack or disconnection occurs in the conductive pattern, and the reliability of the flexible display device is reduced.

In addition, when the conventional flexible display device is repeatedly bent or unbent in directions opposite to each other, the crack or disconnection more often occurs in the conventional flexible display device since it is difficult to secure the flexibility of the bending.

The conductive pattern included in the flexible display device according to the present exemplary embodiment has the above-mentioned grain size or includes the conductive pattern layers each having the above-mentioned grain size, and thus, the flexible display device may secure the flexibility of the bending thereof without increasing the resistance of the conductive pattern. Therefore, although the flexible display device is repeatedly bent or unbent, the crack or disconnection occurring in the conductive pattern may be reduced. Thus, the reliability of the flexible display device according to the present exemplary embodiment may be improved.

In addition, although the flexible display device according to the present exemplary embodiment is repeatedly bent or unbent in directions opposite to each other, the crack or disconnection occurring in the conductive pattern may be reduced since the flexibility of the bending of the flexibility display device is secured.

Hereinafter, a manufacturing method of the flexibility display device according to the present exemplary embodiment will be described in detail.

Figure 10:
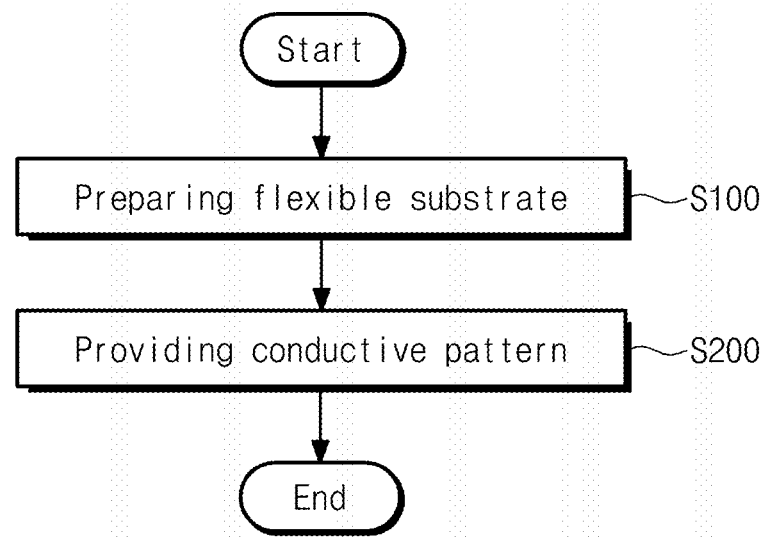
FIG. 10 is a flowchart showing a method of manufacturing a flexible display device according to an exemplary embodiment of the present disclosure.

FIG. 10 is a flowchart showing a method of manufacturing the flexible display device 10 according to an exemplary embodiment of the present disclosure.

Referring to FIGS. 1A to 1C, 2A, 2B, and 10, the manufacturing method of the flexible display device 10 includes preparing the flexible substrate FB (S100) and providing the conductive pattern CP having a grain size of about 10 nm to about 100 nm on the flexible substrate FB (S200).

The flexible substrate FB may include, but is not limited to, the plastic material or the organic polymer, e.g., polyethylene (PET), polyethylene naphthalate (PEN), polyimide, polyether sulfone, etc. The material for the flexible substrate FB is selected in consideration of mechanical strength, thermal stability, transparency, surface smoothness, ease of handling, water repellency, etc. The flexible substrate FB may be transparent.

The conductive pattern CP is provided on the flexible substrate FB. The providing of the conductive pattern CP (S200) is performed by sputtering at least one of the metal, the metal alloy, and the transparent conductive oxide. For instance, the conductive pattern CP is formed by sputtering at least one of the metal, the metal alloy, and the transparent conductive oxide at a room temperature during a time period of about one minute to about three minutes.

The metal may include, but not limited to, at least one of Al, Cu, Ti, Mo, Ag, Mg, Pt, Pd, Au, Ni, Nd, Ir, and Cr.

The transparent conductive oxide may include, but not limited to, at least one of indium tin oxide (ITO), indium zinc oxide (IZO), zinc oxide (ZnO), and indium tin zinc oxide (ITZO).

In the providing of the conductive pattern CP (S200), when the grain size of the conductive pattern CP is less than about 10 nm, the resistance of the conductive pattern CP increases, and thus, power consumption required to drive the flexible display device 10 increases. When the grain size of the conductive pattern CP is greater than about 100 nm, it is difficult to secure flexibility of the bending of the conductive pattern CP since the grain size is excessively large. As a result, a crack or a disconnection occurs in the conductive pattern CP and reliability of the flexible display device 10 is reduced.

The providing of the conductive pattern CP (S200) may include forming the conductive pattern layers CPL, each having a grain size of about 10 nm to about 100 nm. The providing of the conductive pattern CP (S200) may include forming a first conductive layer by sputtering at least one of the metal, the metal alloy, and the transparent conductive oxide, forming a second conductive layer by sputtering at least one of the metal, the metal alloy, and the transparent conductive oxide on the first conductive layer, and etching portions of the first conductive layer and second conductive layer using a mask to form the conductive pattern.

When the grain size of the conductive pattern layers CPL is less than about 10 nm, the resistance of the conductive pattern layers CPL increases, and thus, power consumption required to drive the flexible display device 10 increases. When the grain size of the conductive pattern layers CPL is greater than about 100 nm, it is difficult to secure flexibility of the bending of the conductive pattern layers CPL since the grain size is excessively large. As a result, the crack or disconnection occurs in the conductive pattern layers CPL and reliability of the flexible display device 10 is reduced.

Each of the conductive pattern layers CPL has a thickness of about 10 nm to abut 150 nm. When the thickness of each of the conductive pattern layers CPL is less than about 10 nm, the number of interfaces of the conductive pattern layers CPL increases even though the overall thickness of the conductive pattern CP is not increased, and thus, the resistance of the conductive pattern CP increases. Accordingly, power consumption required to drive the flexible display device 10 increases. In addition, the reliability of the conductive pattern layers CPL may be reduced when each conductive pattern layer CPL is manufactured or provided. When the thickness of each of the conductive pattern layers CPL is greater than about 150 nm, it is difficult to secure flexibility of the conductive pattern layers CPL when the conductive pattern layers CPL are bent. As a result, a crack or a disconnection occurs in the conductive pattern layers CPL and reliability of the conductive pattern layers CPL is reduced.

Each of the conductive pattern layers CPL may include at least one of the metal, the metal alloy, and the transparent conductive oxide, but it should not be limited thereto or thereby.

The metal may include, but not limited to, at least one of Al, Cu, Ti, Mo, Ag, Mg, Pt, Pd, Au, Ni, Nd, Ir, and Cr.

The transparent conductive oxide may include, but not limited to, at least one of indium tin oxide (ITO), indium zinc oxide (IZO), zinc oxide (ZnO), and indium tin zinc oxide (ITZO).

A conductive pattern included in a conventional flexible display device has a grain size greater than that of the conductive pattern according to the present exemplary embodiment, and thus, it is difficult to secure the flexibility of the bending of the conventional flexible display device. Accordingly, when the conventional flexible display device is repeatedly bent or unbent, the crack or disconnection occurs in the conductive pattern and the reliability of the flexible display device is reduced.

In addition, when the conventional flexible display device is repeatedly bent or unbent in directions opposite to each other, the crack or disconnection more often occurs in the conventional flexible display device since it is difficult to secure the flexibility of the bending.

The conductive pattern included in the flexible display device according to the present exemplary embodiment has the above-mentioned grain size or includes the conductive pattern layers each having the above-mentioned grain size, and thus, the flexible display device may secure the flexibility of the bending thereof without increasing the resistance of the conductive pattern. Therefore, although the flexible display device is repeatedly bent or unbent, the likelihood of a crack or a disconnection occurring in the conductive pattern may be reduced. Thus, the reliability of the flexible display device according to the present exemplary embodiment may be improved.

In addition, although the flexible display device according to the present exemplary embodiment is repeatedly bent or unbent in directions opposite to each other, the the likelihood of a crack or a disconnection occurring in the conductive pattern may be reduced since the flexibility of the bending of the flexibility display device is secured.

Hereinafter, the flexible display device according to the present disclosure will be described in detail with reference to various embodiment examples.

Figure 11A:
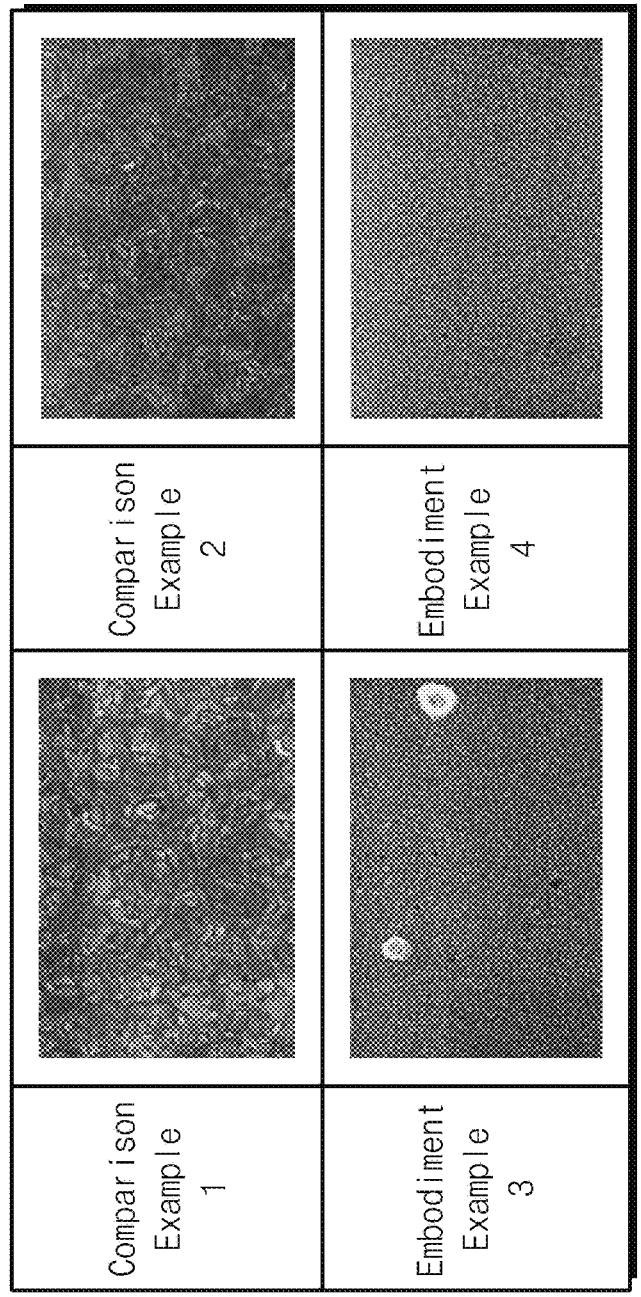
Figure 11B:
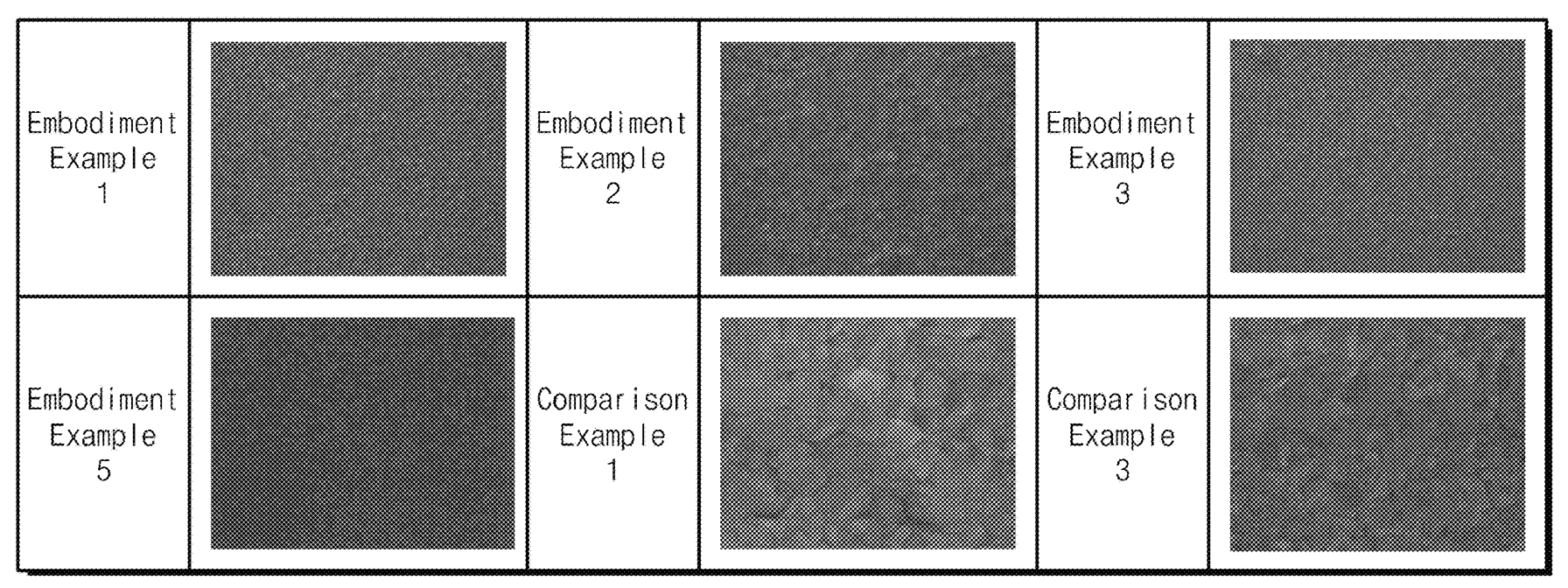
Figure 12:
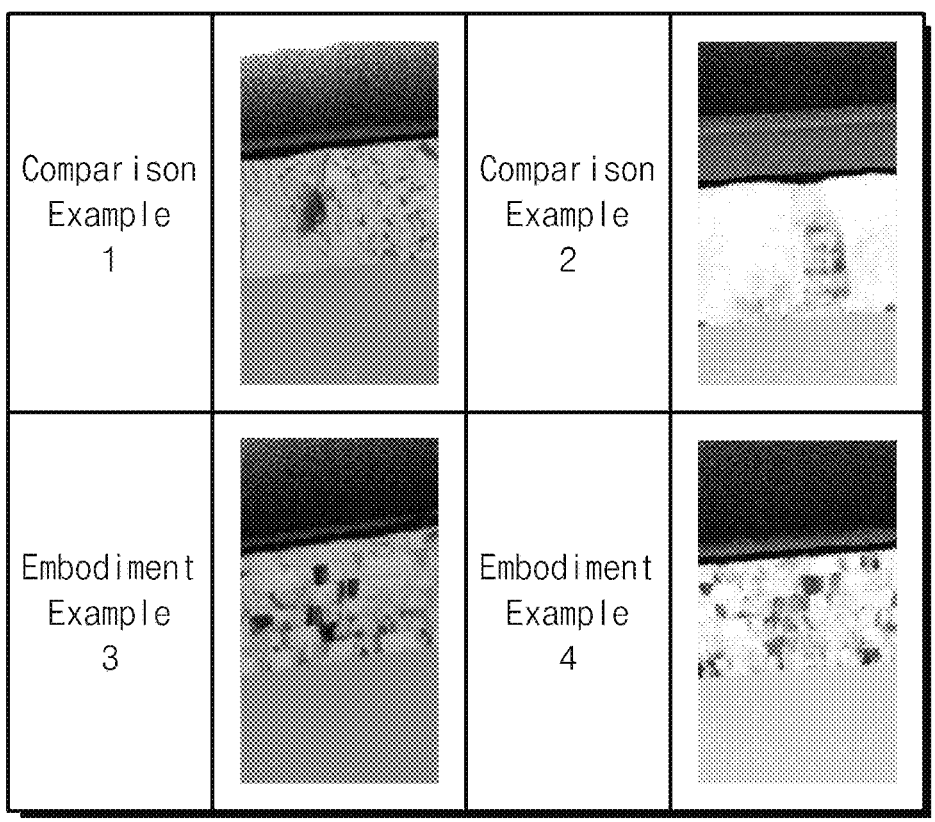
FIG. 12 is a photograph showing a cross section of third and fourth embodiment examples and first and second comparison examples.
Figure 13:
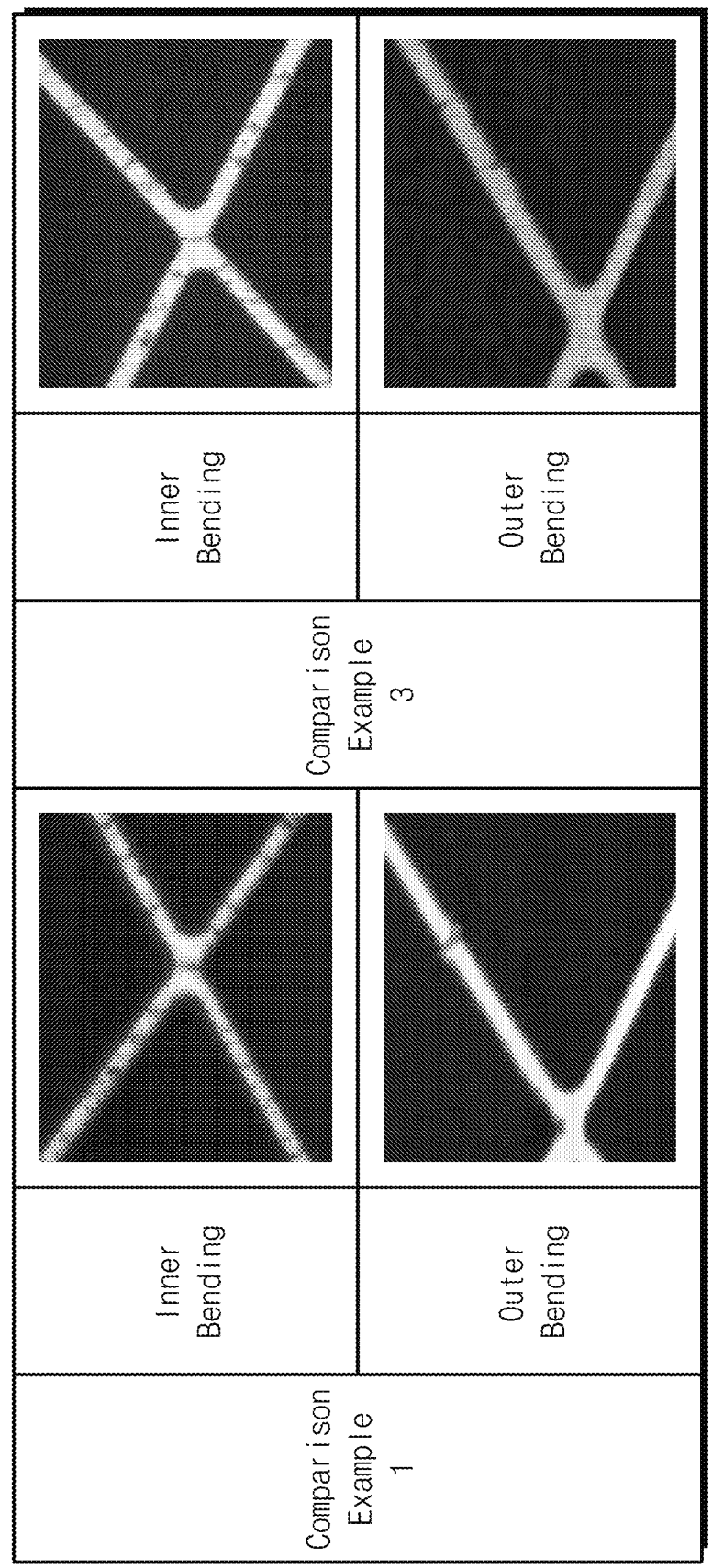
FIG. 13 is a photograph showing a disconnection in first and third comparison examples due to inner and outer bendings.

FIGS. 11A and 11B are SEM images showing first to fourth embodiment examples and first and second comparison examples, FIG. 12 is a photograph showing a cross section of first and second embodiment examples and first and second comparison examples, and FIG. 13 is a photograph showing a disconnection in first and second comparison examples due to inner and outer bendings.

EMBODIMENT EXAMPLE 1

The conductive pattern was formed by sputtering aluminum on a polycarbonate (PC) substrate. The insulating layer was formed on the conductive pattern.

EMBODIMENT EXAMPLE 2

The conductive pattern was formed through the same process as that shown in Embodiment Example 1 except that the conductive pattern formed of aluminum has a thickness of about 100 nm.

EMBODIMENT EXAMPLE 3

A process of sputtering aluminum on the polycarbonate (PC) substrate at a temperature of about 60° C. during about two minutes was performed six times to form six conductive pattern layers, and thus, the conductive pattern including six conductive pattern layers, each having a thickness of about 50 nm, was formed.

EMBODIMENT EXAMPLE 4

The conductive pattern was formed through the same process as that shown in Embodiment example 3 except that the sputtering process was performed at a temperature of about 20° C. rather than about 60° C.

EMBODIMENT EXAMPLE 5

A process of sputtering copper on a polycarbonate (PC) substrate is performed six times on a polycarbonate (PC) substrate to form a conductive pattern layer having a thickness of about 50 nm, and the conductive pattern including six conductive pattern layers was formed.

EMBODIMENT EXAMPLE 6

A first Al conductive pattern layer having a thickness of about 150 nm was formed by sputtering aluminum on a polycarbonate (PC) substrate, a Ti conductive pattern layer having a thickness of about 5 nm was formed by sputtering titanium on the first Al conductive pattern layer, and a second Al conductive pattern layer having a thickness of about 150 nm was formed by sputtering aluminum on the Ti conductive pattern layer.

EMBODIMENT EXAMPLE 7

A first Al conductive pattern layer having a thickness of about 100 nm was formed by sputtering aluminum on a polycarbonate (PC) substrate, a Cu conductive pattern layer having a thickness of about 100 nm was formed by sputtering copper on the first Al conductive pattern layer, and a second Al conductive pattern layer having a thickness of about 100 nm was formed by sputtering aluminum on the Cu conductive pattern layer.

EMBODIMENT EXAMPLE 8

A Ti conductive pattern layer having a thickness of about 20 nm was formed by sputtering titanium on a polycarbonate (PC) substrate, a Cu conductive pattern layer having a thickness of about 150 nm was formed by sputtering copper on the Ti conductive pattern layer, and an Al conductive pattern layer having a thickness of about 150 nm was formed by sputtering aluminum on the Cu conductive pattern layer.

COMPARISON EXAMPLE 1

The conductive pattern was formed through the same process as shown in Embodiment example 1 except that the process of sputtering aluminum on the polycarbonate (PC) substrate was performed at the temperature 60° C. during about two minutes and the conductive pattern has a thickness of about 300 nm.

COMPARISON EXAMPLE 2

The conductive pattern was formed through the same process as that shown in Comparison example 1 except that the sputtering process was performed at a temperature of about 20° C. rather than about 60° C.

COMPARISON EXAMPLE 3

The conductive pattern was formed through the same process as that shown in Embodiment example 1 except that the conductive pattern formed by sputtering aluminum on a polycarbonate (PC) substrate has a thickness 200 nm.

1. Measurement

1) Measurement of the grain size

The grain size was measured by taking a scanning electron microscope (SEM) image of a cross section of Embodiment examples 1 to 3, Embodiment examples 5 to 8, and Comparison examples 1 and 2. The SEM image was taken by using Helios 450, FEI Co. The SEM images are shown in FIGS. 11A and 11B and the grain size is represented by the following Table 1. In addition, SEM images of cross sections of Embodiment examples 3 and 4 and comparison examples 1 and 2 are shown in FIG. 12.

TABLE 1

|  | Grain size (nm) |
| --- | --- |
| Embodiment example 1 | 29 |
| Embodiment example 2 | 58 |
| Embodiment example 3 | 32 |
| Embodiment example 5 | 38.6 |
| Embodiment example 6 | 97.7 |
| Embodiment example 7 | 69.9 |
| Embodiment example 8 | 88.1 |
| Comparison example 1 | 196 |
| Comparison example 2 | 119 |

2) Measurement of the Number of the Grains

The number of the grains arranged within a unit area of about 1.0 square micrometers ($\mu m^2$) was measured by taking an SEM image of the conductive pattern of Embodiments 1 and 2 and Comparison examples 1 and 2. The number of the grains is represented by the following Table 2.

TABLE 2

|  | Number of grains |
| --- | --- |
| Embodiment example 1 | 1189 |
| Embodiment example 2 | 297 |
| Comparison example 1 | 26 |
| Comparison example 2 | 71 |

3) Check whether the Disconnection Occurs Due to the Inner Bending and the Outer Bending The disconnections due to the inner bending and the outer bending of Embodiment examples 1 to 8 and Comparison examples 1 and 3 were checked. The disconnections due to the inner bending in Comparison examples 1 and 3 are shown in FIG. 13.

4) Measurement of a Resistance Variation Due to the Inner Bending and the Outer Bending The resistance variation due to the inner bending in Embodiment examples 1 and 2 and Comparison examples 1, 2, and 5 and the resistance variation due to the outer bending in Embodiment examples 1 and 2 and Comparison examples 1 and 3 were measured. The resistance variation due to the inner bending is represented by the following Table 3 and the resistance variation due to the outer bending is represented by the following Table 4.

TABLE 3

| Number of inner bendings | Resistance variation (%) | | | | |
|---|---|---|---|---|---|
| | Embodiment example 1 | Embodiment example 2 | Embodiment example 5 | Comparison example 1 | Comparison example 3 |
| 0 | 0 | 0 | 0 | 0 | 0 |
| 50000 | 0 | 0 | 0 | 500 | 0 |
| 100000 | 0 | 0 | 0 | 500 | 9 |
| 150000 | 0 | 0 | 0 | 500 | 19 |
| 200000 | 0 | 0 | 0 | 500 | 24 |

TABLE 4

| Number of outer bendings | Resistance variation (%) | | | | |
|---|---|---|---|---|---|
| | Embodiment example 1 | Embodiment example 2 | Embodiment example 5 | Comparison example 1 | Comparison example 3 |
| 0 | 0 | 0 | 0 | 0 | 0 |
| 50000 | 0 | 0 | 0 | 303 | 0 |
| 100000 | 2 | 4 | 5 | 448 | 11 |
| 150000 | 3 | 6 | 5 | 506 | 27 |
| 200000 | 3 | 10 | 5 | 528 | 54 |

2. Measurement Result

1) Measurement of the Grain Size

Referring to FIGS. 11A, 11B, and 12 and Table 1, the grain size of each of Embodiment examples 1 to 8 was less than the grain size of each of Comparison examples 1 and 2.

2) Measurement of the Number of

As represented by Table 2, the number of the grains of Embodiment examples 1 and 2 was less than the number of the grains of Comparison examples 1 and 3.

3) Check whether the Disconnection Occurs Due to the Inner Bending and the Outer Bending The disconnections due to the inner bending and the outer bending do not occur in Embodiment examples 1 to 8, but the disconnections due to the inner bending and the outer bending occur in Comparison examples 1 and 3 as shown in FIG. 13.

4) Measurement of a Resistance Variation Caused by the Inner Bending and the Outer Bending Referring to Tables 3 and 4, the variation in resistance due to the inner bending is and the outer bending was relatively small in Embodiment Examples 1, 2, and 5, but the variation in resistance due to the inner bending and the outer bending was relatively large in Comparison Examples 1 and 3.

According to the above, the likelihood of an occurrence of the crack due to the bending may be reduced. In addition, the flexible display device, in which the occurrence of the crack due to the bending is reduced, may be manufactured.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A flexible display device comprising:
a flexible display panel comprising a panel bending part; and
a touch screen panel comprising a touch bending part and disposed on the flexible display panel,
wherein:
the flexible display panel comprises:
a flexible substrate comprising a bending part;
a thin film transistor comprising a source part, a drain part, and a channel part; and
an organic light emitting element electrically connected to the thin film transistor;
the touch screen panel comprises a sensing electrode including a plurality of grains consisting of aluminum or aluminum oxide; and
the plurality of grains are stacked in a thickness direction forming a multilayer in one layer of the sensing electrode.

2. The flexible display device of claim 1, wherein the sensing electrode has a thickness of about 10 nm to about 150 nm.

3. The flexible display device of claim 1, wherein the sensing electrode comprises a mesh structure.

4. A flexible display device comprising:
a flexible display panel; and
a touch screen panel comprising a touch bending part, wherein:
the flexible display panel comprises:
a flexible substrate comprising a bending part;
a thin film transistor comprising a source part, a drain part, and a channel part; and
an organic light emitting element electrically connected to the thin film transistor;
the touch bending part comprises a sensing electrode having a mesh structure; the sensing electrode at the touch bending part includes a plurality of grains consisting of aluminum or aluminum oxide; and
the plurality of grains are stacked in a thickness direction forming a multilayer in one layer of the sensing electrode.

5. The flexible display device of claim 1, wherein each of the grains has an average size of about 10 nm to about 100 nm.

6. The flexible display device of claim 4, wherein each of the grains has an average size of about 10 nm to about 100 nm.

* * * * *